United States Patent [19]

Thompson

[11] Patent Number: 4,794,558

[45] Date of Patent: Dec. 27, 1988

[54] MICROPROCESSOR HAVING SELF-PROGRAMMED EPROM

[75] Inventor: Robert R. Thompson, Largo, Fla.

[73] Assignee: Motorola, Inc., Schaumburg, Ill.

[21] Appl. No.: 912,183

[22] Filed: Sep. 25, 1986

Related U.S. Application Data

[63] Continuation of Ser. No. 47,674, Jun. 12, 1979, abandoned.

[51] Int. Cl.⁴ .............................................. G06F 9/22
[52] U.S. Cl. .................................................. 364/900
[58] Field of Search ... 364/200 MS File, 900 MS File

[56] References Cited

U.S. PATENT DOCUMENTS

| | | | |
|---|---|---|---|
| 3,978,457 | 8/1976 | Check et al. | 364/200 |
| 4,018,565 | 4/1977 | Fletcher et al. | 364/500 |
| 4,045,660 | 8/1977 | Weisgerber | 364/170 |
| 4,053,735 | 10/1977 | Foudos | 235/419 |
| 4,078,259 | 3/1978 | Soulsby et al. | 364/900 |
| 4,105,156 | 8/1978 | Dethleff | 235/441 |
| 4,107,785 | 8/1978 | Seipp | 364/900 |
| 4,153,933 | 5/1979 | Blume et al. | 364/200 |
| 4,155,071 | 5/1979 | Shamburger | 371/71 |
| 4,382,279 | 5/1983 | Ugon | 364/200 |

Primary Examiner—David Y. Eng
Attorney, Agent, or Firm—John A. Fisher; Jeffrey Van Myers

[57] ABSTRACT

A single-chip microcomputer comprises a CPU (1), a RAM (2), an EPROM (3), a timer (4), serial I/O communication logic (5), four I/O ports (11-14) and an input pin for providing a $\overline{\text{RESET}}$ signal or programming potential $V_{PP}$ (23). An EPROM control register (53) in the CPU is loadable under the control of a computer program stored in an external memory (40). Responsive to a first bit in the EPROM control register an address buffer/latch 61 and a data latch 62 temporarily latch address and data information during a write operation to the EPROM. Responsive to a second bit in the EPROM control register the programming potential is applied to the EPROM for a predetermined time to program the data information into the EPROM at its associated address. The accuracy of the programming operation may be verified using the CPU under the control of the external computer program, to compare the address and data information programmed into the EPROM with the original source of such information.

4 Claims, 13 Drawing Sheets

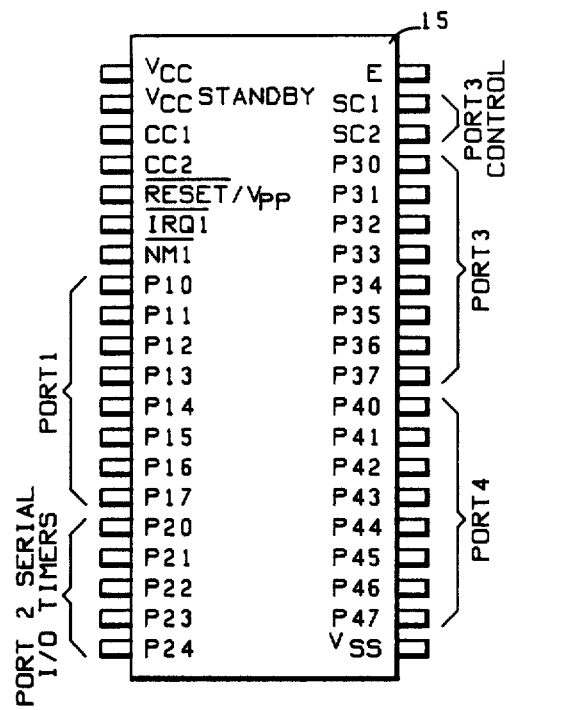
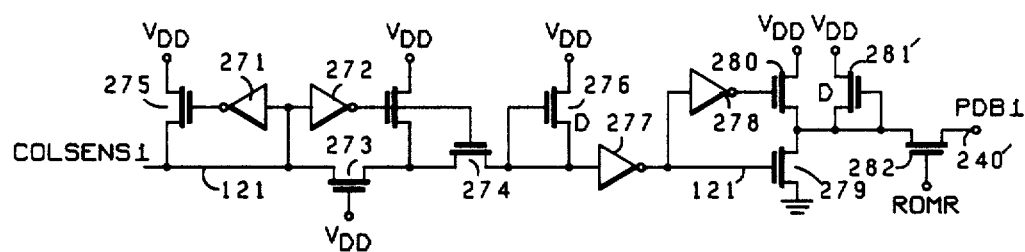
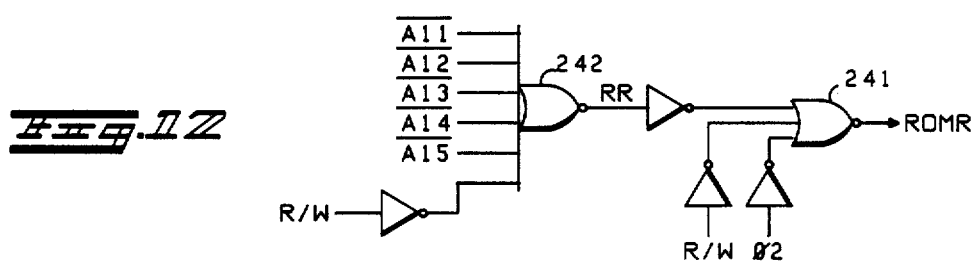

MICROPROCESSOR HAVING SELF-PROGRAMMED EPROM

This is a continuation of application Ser. No. 047,674, filed 6/12/79 now abandoned.

RELATED INVENTIONS (1) Ser. No. 939,743, filed Sept. 5, 1978, of Groves, entitled NRZ/Biphase Microcomputer Serial Communication Logic and assigned to the assignee of the present invention which issued Aug. 24, 1982, U.S. Pat. No. 4,346,452.

(2) Ser. No. 939,741, filed Sept. 5, 1978, of Daniels et al, entitled Microprocessor Having Plural Internal Data Buses and assigned to the assignee of the present invention which issued May 5, 1981, U.S. Pat. No. 4,266,270.

(3) Ser. No. 945,737, filed Sept. 25, 1978, of Chamberlin, entitled Real Time Capture Registers For Data Processor and assigned to the assignee of the present invention which issued Sept. 9, 1980 as U.S. Pat. No. 4,222,103.

TECHNICAL FIELD

This invention relates generally to the field of data processing and, more particularly, to a single-chip microcomputer having an erasable programmable read only memory (EPROM) which may be programmed using the central processing unit (CPU) of the microcomputer.

BACKGROUND ART

Microcomputers are sophisticated, general purpose logic devices which can be programmed to perform a wide variety of useful control functions in industrial and communications equipment, large-scale and medium-scale computer peripheral and terminal hardware, automobiles and other transportation media, amusement and education devices and the like. Generally, an entire spectrum of microcomputers is presently available in the commercial marketplace. The MC6801 microcomputer commercially available from Motorola, Inc., is an 8-bit microcomputer comprising a CPU, 128 bytes of random access memory (RAM), 2K bytes of EPROM, a 16-bit timer, and four I/O ports for communicating with external equipment.

It is known in the microcomputer technology to provide an EPROM as a component part of a overall single-chip microcomputer. For example, the MCS8748 commercially available from Intel Corporation is a single-chip microcomputer which includes an EPROM. The MCS8748 EPROM is programmed utilizing a microcomputer development system. The microcomputer development system requires an independent processor, operating under the control of an EPROM loading program, to program the EPROM. The MCS8748 contains at least three pins, out of a total of 40 pins, whose function is dedicated to pogramming the EPROM. A T0 pin is set low to select the programming mode; an EA pin is raised to 25 volts to activate the programming mode; and a PROG pin is raised to 25 volts for a 50 millisecond pulse to program data into the EPROM.

It is desirable to eliminate the necessity for dedicated programming pins in a microcomputer having an EPROM, since such programming pins are used only during the EPROM programming operation and might otherwise be more usefully employed in providing other I/O or control functions to the microcomputer.

BRIEF SUMMARY OF THE INVENTION

It is an object of the present invention to eliminate the necessity of providing dedicated programming pins in a microcomputer comprising an EPROM.

It is another object of the present invention to provide a microcomputer, including an EPROM, with the capability of utilizing its own CPU, under the control of an appropriate computer program, to program the EPROM.

These and other objects of the invention are achieved in accordance with a preferred embodiment of the invention by providing in a microcomputer comprising a processor and a programmable read only memory (PROM), a method of programming the PROM, comprising the steps of coupling a source of information to the microcomputer to be programmed into the PROM and operating the processor under the control of a computer program to program the information into the PROM.

According to another embodiment of the invention there is provided in a microcomputer comprising a processor, a programmable read only memory (PROM), and at least one I/O port for communicating with a source of address and data information, means for programming the data information into the PROM using the processor under control of a computer program, the programming means comprising a temporary storage means loadable by the processor for storing first and second control bits, latching means responsive to the state of the first control bit for latching a unique combination of address and data information transmitted to the I/O port by the source, means for providing a programming potential to the microcomputer, and a programming circuit coupled to the PROM and responsive to the latching means, the second control bit, and the programming potential for coupling the programming potential to the PROM for a predetermined time period to program the unique data information into the PROM at the associated address.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 3 illustrates a pin-out arrangement of the single-chip microcomputer which embodies the present invention.

FIG. 11 shows a circuit diagram of a representative one of the sense amps associated with the EPROM array.

FIG. 12 shows a logic diagram of the sense amp enabling circuitry.

DETAILED DESCRIPTION OF THE INVENTION

Table of Contents

General Description
 EPROM Programming and Verifying System
 Microcomputer Architecture
Detailed Description
 EPROM Programming Circuitry
 EPROM Control Register
 EPROM Address and Data Latches
 EPROM Word Line Decoding Circuitry
 EPROM Column Decoding Circuitry
 Miscellaneous Circuitry
 EPROM Programming Monitor
Operation of Preferred Embodiment

GENERAL DESCRIPTION

The present invention constitutes both a method and apparatus for programming and verifying the contents of an EPROM in a single-chip microcomputer. In a preferred embodiment of the invention, the microcomputer with EPROM forms part of a program development system which now will be described with reference to FIG. 1.

EPROM Programming and Verifying System

Figure 1:
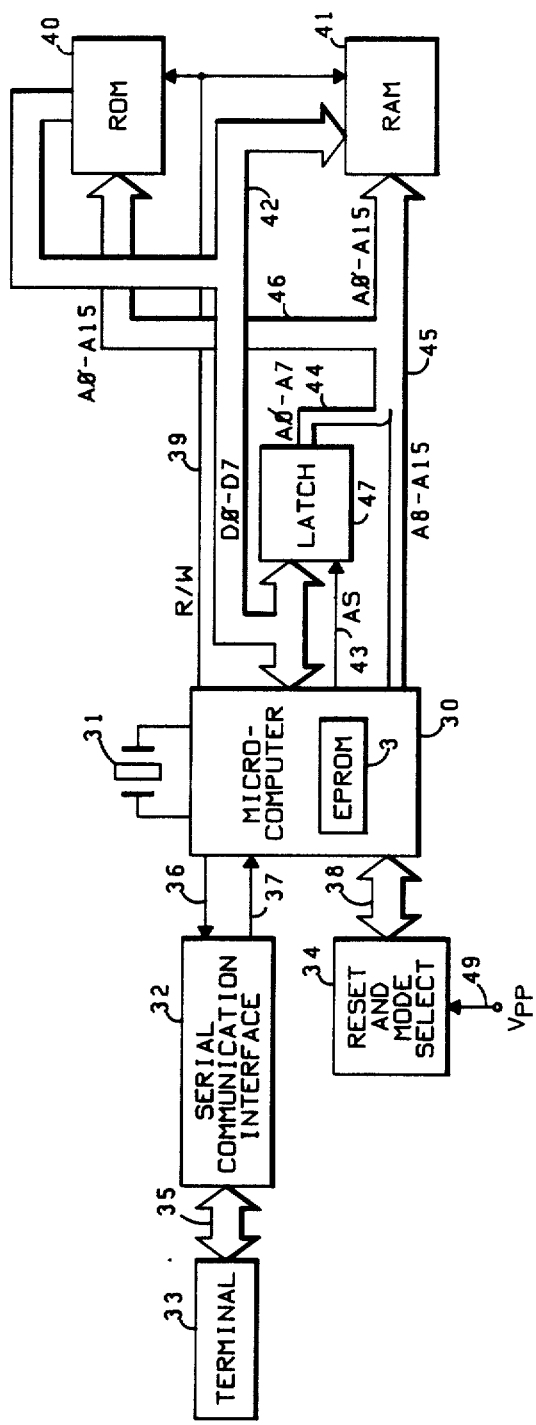
FIG. 1 shows a block diagram of a single-chip microcomputer, including an EPROM, as a portion of a system for programming and verifying the EPROM.

With reference to FIG. 1, a block diagram of an exemplary program development system is shown, in which a microcomputer 30 with EPROM 3 forms the central component. Coupled to microcomputer 30 via I/O lines 36 and 37 is a serial communication interface 32, which provides the essential communications interface between microcomputer 30 and the user terminal 33. Terminal 33 is coupled to serial communication interface 32 by a plurality of data and control lines represented by bus 35. Using the terminal 33, the operation of microcomputer 30 and its associated peripheral devices may be controlled in such a manner as to develop a computer program, load such program into EPROM 3, and verify that the program has been correctly loaded.

A reset and mode select circuit 34 is connected to microcomputer 30 through several control lines shown generally as bus 38. The reset and mode select circuit 34 is coupled to a high voltage source $V_{PP}$ over line 49, which high voltage source is used in a controlled manner to program the EPROM. As will be further explained hereinafter, the reset and mode select circuit 34 is used to select the operational mode of microcomputer 30, as well as to supply $V_{PP}$ to EPROM 3 and its associated cnntrol circuitry. While several modes will be mentioned in the ensuing description, only mode 0, the EPROM programming mode, is important in the context of the present invention.

External ROM 40 is connected to microcomputer 30 by means of data bus 42 comprising data lines D0-D7, address bus 46 comprising address lines A0-A15, and read/write (R/W) line 39. External ROM 40 is used in a preferred embodiment to store a programming monitor, which is a computer program especially designed for programming and verifying the contents of EPROM 3. As will be further explained below, the central processing unit (CPU) of microcomputer 30 is controlled by the programming monitor stored in external ROM 40 to load and verify the contents of EPROM 3.

External RAM 41 is also connected to microcomputer 30 by means of data bus 42, address bus 46, and R/W line 39. External RAM 41 may be used for program development purposes in the system shown in FIG. 1; however, its presence in the system shown in FIG. 1 and its operation are not essential to the present invention and will not be further described.

Also shown in FIG. 1 is a latch 47 for latching the low-order address bits A0-A7 received from microcomputer 30 when it is operated in the expanded, multiplexed mode (mode 6) of operation. In such mode Port 3 of microcomputer 30, from which both data D0-D7 and the low-order address A0-A7 are multiplexed, must be connected to latch 47 to temporarily latch the low-order address A0-A7 so that such may be concatenated with the high-order address A8-A15. Latch 47 latches the low-order address A0-A7 in response to an address strobe (AS) received from microcomputer 30 over line 43. The low-order address bits are output from latch 47 over bus 44, with which they are joined by the high-order address bits output from microcomputer 30 over bus 45 to form address bus 46.

A parallel resonance crystal 31 is shown connected to microcomputer 30. Alternately, microcomputer 30 may be driven by an external clock source.

Figure 22:
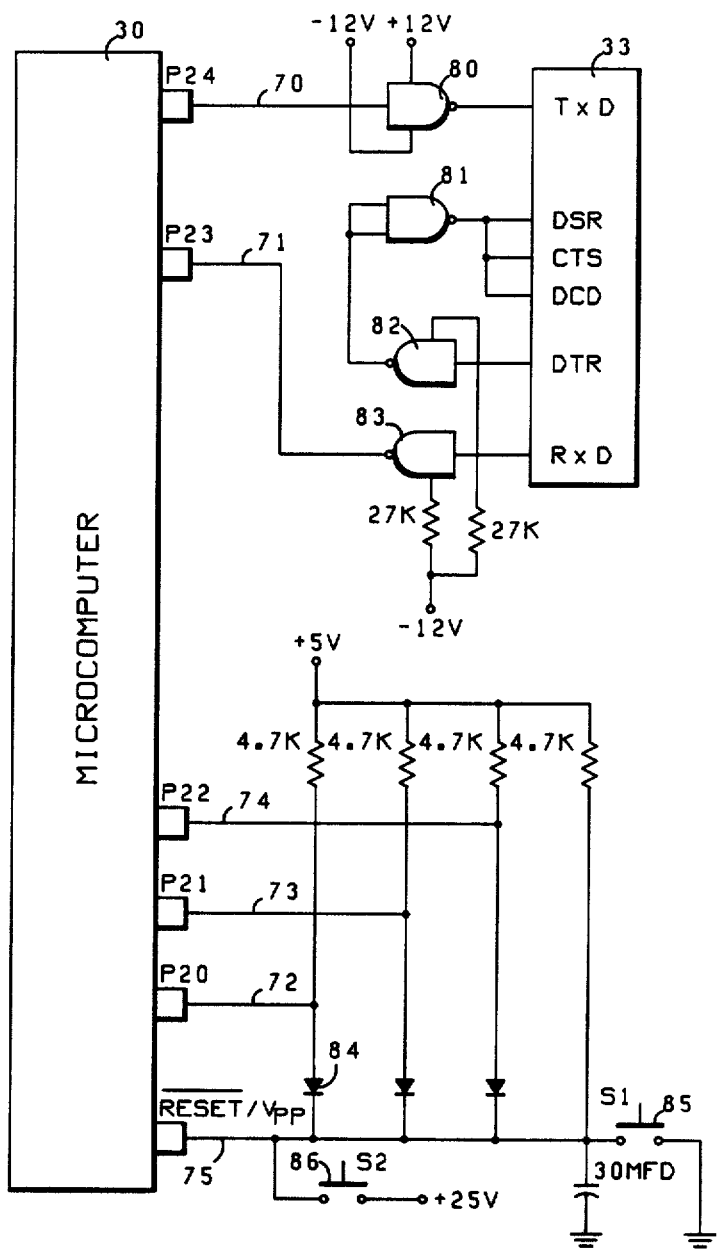
FIG. 22 shows a combination logic and circuit diagram of the serial communication interface.

In a preferred embodiment of the invention, microcomputer 30 comprises the MC68701 commercially available from Motorola, Inc. The serial communication interface 32 and the reset and mode select circuit 34 may be as shown in FIG. 22. The serial communication interface 32 shown in FIG. 22 provides an RS232C interface capability. Terminal 33 may be any of several commercially available terminals which utilize the commonly available RS232C interface.

With reference to FIG. 22, the transmit data (TxD) line 70 is connected to pin 4 of Port 2 of microcomputer 30 through logic gate 80 which may comprise a commercially available MC1488 from Motorola, Inc. The receive data line (RxD) is connected to pin 3 of Port 2 of microcomputer 30 over line 71 through logic gate 83, which may comprise an MC1489 device from Motorola, Inc. Logic gate 83 forms part of a logic circuit comprising logic gates 81 and 82 for handling the terminal control signals, including DSR (Data Set Ready), CTS (Clear To Send), DCD (Data Carrier Detect), and DTR (Data Terminal Ready). Logic gate 81 may be of the same type as logic gate 80, and logic gate 82 may be of the same type as logic gate 83.

Regarding the reset and mode select circuit shown in the lower portion of FIG. 22, lines 72-74 are connected to pins 0-2, respectively, of Port 2, and line 75 is connected to the $\overline{\text{RESET}}/V_{PP}$ pin of microcomputer 30. To reset microcomputer 30, switch 85 is depressed to provide low signal levels at pins P20-P22 causing microcomputer 30 to revert to mode 0, the reset mode. During the EPROM loading operation, the high voltage source of 25 volts is provided at the $\overline{\text{RESET}}/V_{PP}$ pin by depressing switch 86.

The frequency of crystal 31 in a preferred embodiment as shown in FIG. 1 should be either 4.9152 MHz or 2.4576 MHz in order to give a standard baud rate for the serial communication interface 32.

Latch 47 shown in FIG. 1 may be a transparent octal D-type latch available as part number SN74LS373 from Texas Instruments. External ROM 40 and external RAM 41 may be any of several commercially available devices. In a preferred embodiment, external ROM 40 is available in the form of a programmed ROM (PROM) SCM44126P from Motorola, Inc. and which contains substantially the computer program (programming monitor) attached hereto as Appendix I.

Microcomputer Architecture

Figure 2:
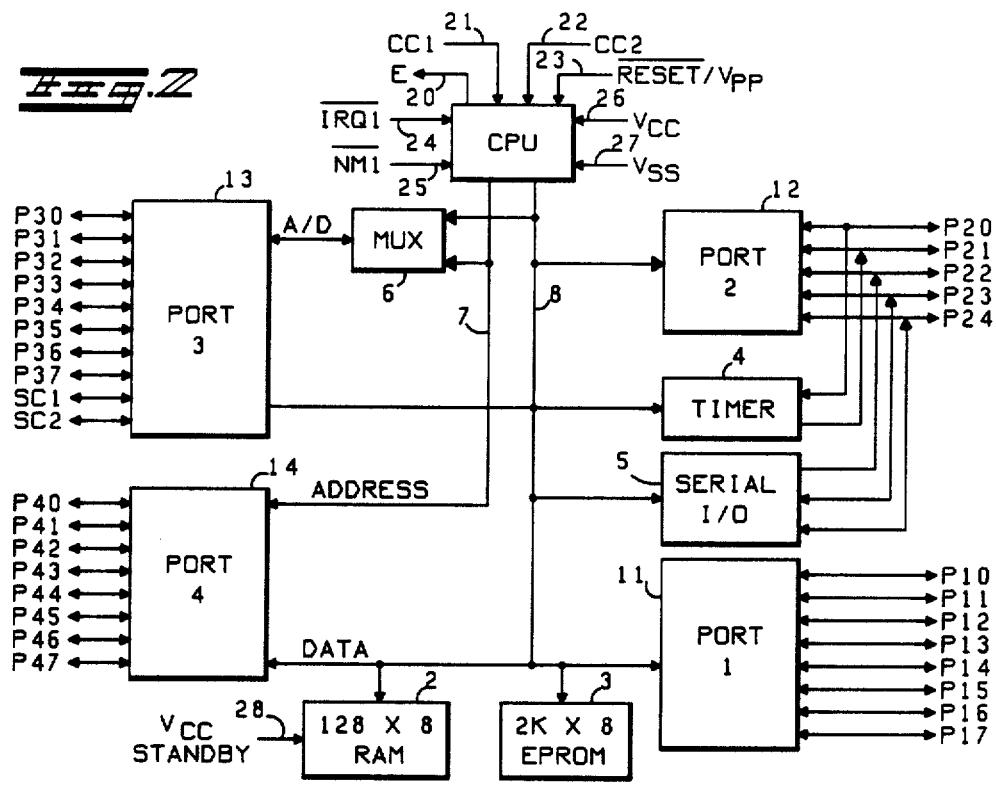
FIG. 2 shows a block diagram of a single-chip microcomputer which embodies the present invention.

With reference to FIG. 2, a block diagram of the single-chip microcomputer 30 embodying the present invention is shown.

The microcomputer shown in FIG. 2 comprises a central processor (CPU) 1, a random access memory (RAM) 2, an erasable programmable read-only-memory (EPROM) 3, a timer circuit 4, and a serial I/O portion 5 as major functional blocks. The microcomputer shown in FIG. 2 also comprises a multiplexer (MUX) 6, an internal address bus 7, an internal data bus 8, and four I/O ports 11-14. CPU 1 may be connected to an external crystal through crystal connections CC1 and CC2 over lines 21 and 22, respectively, and it supplies an external clock signal E over line 20 to other system components. CPU 1 is also responsive to a $\overline{\text{RESET}}$ signal or $V_{PP}$ potential over line 23, an interrupt request signal ($\overline{\text{IRQ1}}$) over line 24, a non-maskable interrupt signal ($\overline{\text{NMI}}$) over line 25, a power supply signal ($V_{CC}$) over line 26, and a ground signal ($V_{SS}$) over line 27. The RAM 2 receives a $V_{CC}$ standby supply over line 28 to preserve data in the RAM in the event of a power failure.

Ports 1, 3, and 4 are 8-bit ports, and port 2 is a 5-bit port. The eight lines, P1-P17, into port 1 are dedicated solely to parallel I/O operations. The lines into ports 2-4 may be configured in different ways depending upon one of several possible modes of operating the microcomputer shown in FIG. 2. Port 2 has five lines P20-P24. Port 3 has eight lines P30-P37 and two strobe control lins, SC1 and SC2. Control lines SC1 and SC2 into port 3 serve as input and output strobes, SC1 in particular serving as an address strobe to latch 47 of FIG. 1. Port 4 has eight lines P40-P47.

In the single chip mode (mode 7) all I/O lines of ports 2-4 can be programmed to serve either as inputs or outputs, in accordance with a data direction register associated with each port. In the expanded non-multiplexed mode (mode 5) lines P30-P37 of port 3 function as the external data bus (D0-D7), and lines P40-P47 of port 4 serve as the low-order address lines (A0-A7). If any of the eight address lines are not needed in this mode the remaining lines may be configured as I/O. In the expanded multiplexed mode (mode 6), lines P30-P37 of port 3 serve both as the external data bus (D0-D7) and as the low-order address bus (A0-A7). In this mode, lines P40-P47 of port 4 serve as the high-order address lines (A8-A15). If any of the eight high-order address lines are not needed in this mode the remaining lines may be configured as I/O.

In all three of the above mentioned modes, lines P20-P24 of port 2 can be configured either as input or output lines by a data direction register associated with this port. Port 2 also provides access to the serial I/O communications capability and the programmable timer capability of the microcomputer. Pins P20-P22 of port 2 are used to select the operational mode of microcomputer 30 during reset. When $\overline{\text{RESET}}$ goes high, pins P20-P22 latch mode control signal PC0-PC2. The mode control register circuitry for pins P20 and P21 is identical to that shown for pin P22 in FIG. 8G of the above-referenced Ser. No. 939,743.

FIG. 3 provides a schematic representation 15 of the pin-out arrangement of the microcomputer of FIGS. 1 and 2.

DETAILED DESCRIPTION

The single-chip microcomputer 30 shown in FIGS. 1 and 2 comprises special circuitry for controlling the programming and verification of the contents of EPROM 3. Such circuit permits the CPU 1 of microcomputer 30 to carry out the programming and verification functions under the control of the program monitor resident in the external ROM 40. A detailed description of the specific EPROM-related circuitry, as well as such other circuitry of microcomputer 30 as is required to fully describe the invention, will now be given.

EPROM Programming Circuitry

Figure 4:
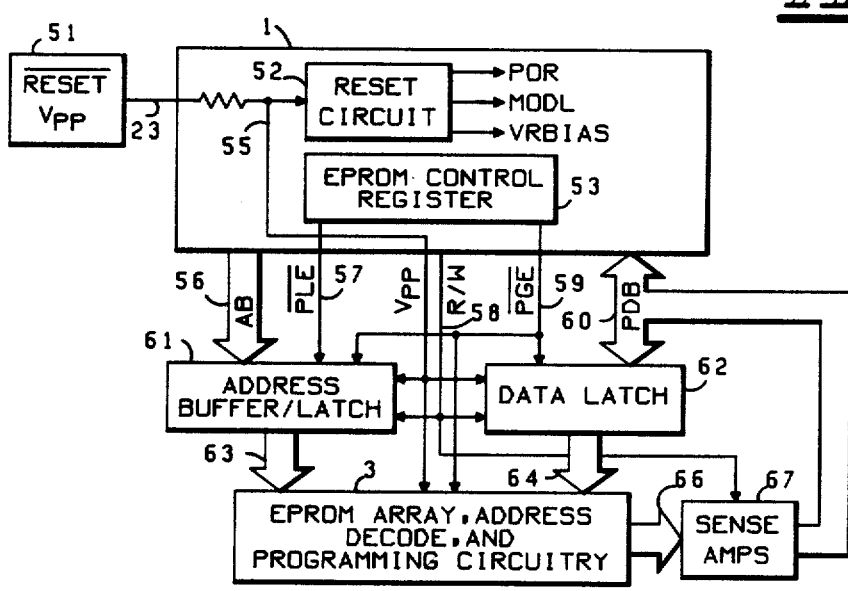
FIG. 4 illustrates a block diagram of a portion of the internal microcomputer structure, including the CPU and the EPROM, which embodies the present invention.

Referring now to FIG. 4, a block diagram is shown of a portion of the internal structure of microcomputer 30, including CPU 1 and EPROM 3. Reference may be had to the above-mentioned Ser. No 939,741 for a detailed description of a CPU substantially identical to CPU 1 of the present invention. CPU 1 of the present invention differs from the CPU in the above-referenced invention substantially as shown in FIG. 4, wherein the $\overline{\text{RESET}}$ pin in the present invention also serves to provide the programming potential $V_{PP}$ over lines 23 and 55 to the EPROM 3. CPU 1 of the present invention also contains an EPROM control register 53 loadable from the internal data bus PDB0-PDB7 of the CPU. Details of the EPROM control register 53 are given below under the subheading of the same name. The $\overline{\text{RESET}}/V_{PP}$ pin 51 performs three functions for microcomputer 30. The first of these three functions is to reset microcomputer 30, and the potential on the $\overline{\text{RESET}}/V_{PP}$ pin must be below 0.8 volts for this to occur. The second function is for normal program execution, wherein EPROM 3 is only being read, and the potential on the $\overline{\text{RESET}}/V_{PP}$ pin must be at a logic 1 level (5.0 volts at 8 ma). The third function of the $\overline{\text{RESET}}/V_{PP}$ pin is to supply the programming potential $V_{PP}$ to EPROM 3. The programming potential is 25 volts at a current of 30 ma maximum.

During the normal (read) operation of EPROM 3 the address buffer/latch 61 and data latch 62 are not enabled, so address information flows through address bus 56, address buffer/latch 61 and address bus 63 directly to EPROM 3, and data information flows directly through the internal peripheral data bus (PDB) 60, data latch 62, and data bus 64 to EPROM 3.

EPROM control register 53 provides temporary storage for at least two control bits $\overline{\text{PGE}}$ (program enable) and $\overline{\text{PLE}}$ (program latch enable). For normal (read) operation of EPROM 3, both $\overline{\text{PGE}}$ and $\overline{\text{PLE}}$ are a logical 1. During the programming of EPROM 3 $\overline{\text{PLE}}$ is set to 0 in order to latch address and data information in the address buffer/latch 61 and data latch 62, respectively. During that portion of a programming operation when it is specifically desired to apply the programming potential $V_{PP}$ to EPROM 3, $\overline{\text{PGE}}$ is momentarily set to 0 for a time duration of approximately 50 msec. During read operations of EPROM 3, the R/W signal transmitted over line 58 is at a logical 1 and during write operations R/W signal is at a logical 0. During read operations, sense amps 67 amplify the output signals from EPROM 3 representing the individual bits in a word corresponding to a designated address and transmit the corresponding bits over PDB 60 to CPU 1.

EPROM Control Register

Figure 5:
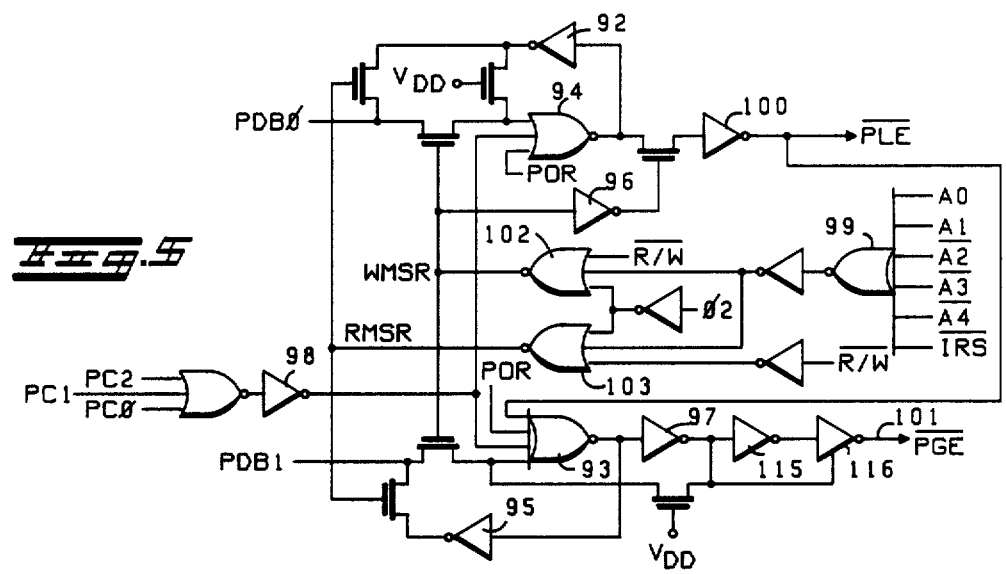
FIG. 5 shows a logic diagram of a portion of the EPROM control register.
Figure 25A:
FIG. 25A shows a logic symbol of a push-pull inverter.
Figure 25B:
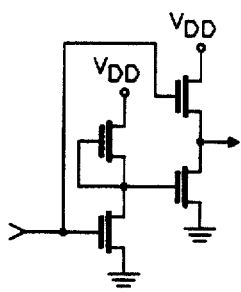
FIG. 25B shows the corresponding circuit diagram.

FIG. 5 shows a logic diagram of that portion of the EPROM control register 53 which stores the $\overline{\text{PGE}}$ and $\overline{\text{PLE}}$ control bits. The $\overline{\text{PLE}}$ control bit is loaded by the CPU 1 into the individual $\overline{\text{PLE}}$ register cell comprising NOR gate 94 and inverter 92 by means of PDB 0. The $\overline{\text{PGE}}$ bit is loaded by the CPU 1 into the corresponding register cell of the EPROM control register 53, comprising NOR gate 93 and inverter 97, by means of PDB 1. The output of the $\overline{\text{PGE}}$ register cell is transmitted through push-pull inverters 115 and 116, whose circuit diagram is illustrated in FIG. 25B.

A write operation to the EPROM control register 53 is enabled when SIGNAL WMSR goes high. This occurs when $\overline{\text{R/W}}$ is low, $\phi 2$ is high, and the output of NOR gate 99 is high. NOR gate 99 goes high when address $14 (using hexadecimal notation), representing the address of EPROM control register 53 in the microcomputer address space, is applied as an input to NOR gate 99 along with the internal register select ($\overline{\text{IRS}}$) signal in a low state. The inverse of the $14 address, represented symbolically in FIG. 5 by $\overline{\text{A4}}$ A3 $\overline{\text{A2}}$ A1 A0, allows the output of NOR gate 99 to go high.

A read operation of EPROM control register 53 is enabled under the same conditions except that the R/W signal must be high. For either $\overline{\text{PGE}}$ or $\overline{\text{PLE}}$ to be in the low state, each of te program control bits PC0-PC2 must be in their low state, representing mode 0, the programming mode. In addition the power-on reset (POR) signal must be in its low state.

EPROM Address and Data Latches

Figure 6:
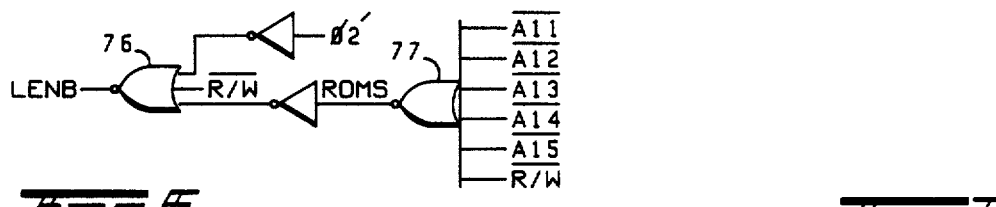
FIG. 6 shows a logic diagram of the circuit for enabling the address and data latches associated with EPROM array.
Figure 23:
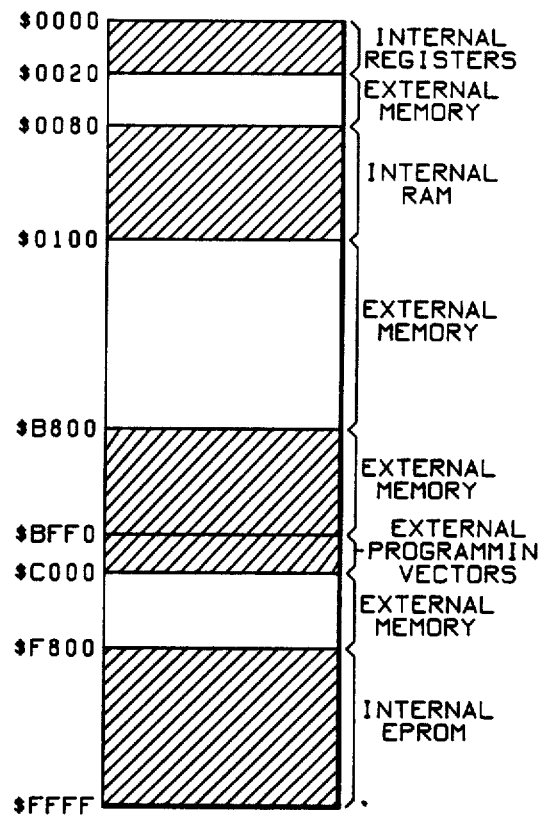
FIG. 23 represents a memory map of the address space of the single-chip microcomputer which embodies the present invention.

FIG. 6 shows a logic diagram of the circuit for enabling the address buffer/latch 61 and the data latch 62 associated with the EPROM array. The latch enable (LENB) output of NOR gate 76 is high when $\phi 2'$ is high, R/W is low, and the ROMS output of NOR gate 77 is high. Signal ROMS is high when R/W is low and when an address representing an EPROM address appears on the microcomputer internal address bus 56 (FIG. 4). The EPROM memory space is $F800-$FFFF as shown in FIG. 23, and this range of addresses is represented when A11-A15 are all high. The inverse of this condition permits NOR gate 77 to be enabled, and such inverse condition is represented symbolically in FIG. 6 by $\overline{\text{A15}}$ $\overline{\text{A14}}$ $\overline{\text{A13}}$ $\overline{\text{A12}}$ $\overline{\text{A11}}$.

Figure 7:
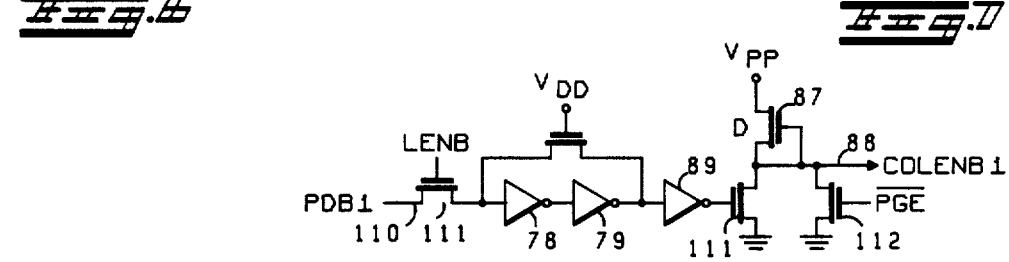
FIG. 7 shows a logic diagram of the data latch associated with the EPROM array.

FIG. 7 shows a logic diagram of a representative one of the eight data latches associated with the EPROM array. A representative one of the PDB lines 110 is coupled to the data latch by means of transfer gate 111, which is enabled by signal LENB. The data latch itself comprises inverters 78 and 79, the output of inverter 79 being fed back to the input of inverter 78. The data latch 62 also includes an inverter 89, enhancement mode gates 111 and 112, and depletion mode gate 87. The drain of depletion mode gate 87 is coupled to $V_{PP}$. Line 88 is a high voltage line during the programming mode. The column enable signal COLENBi generated over line 88 is applied to gate 120 of FIG. 10A, permitting $V_{PP}$ to be conducted through gate 120 to line 121 for a purpose to be later described.

Figure 8:
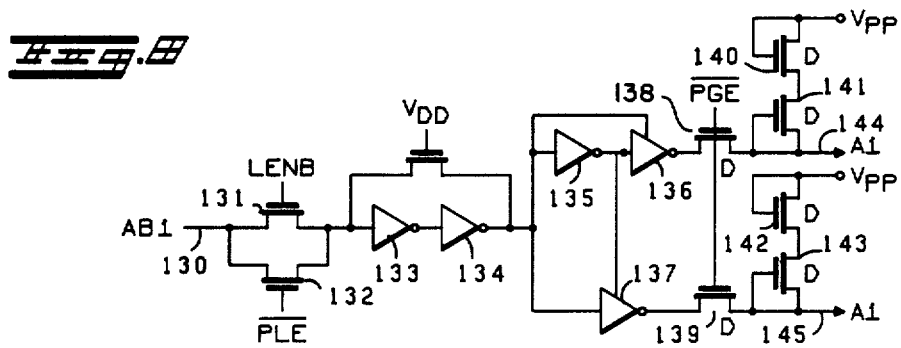
FIG. 8 shows a logic diagram of the address buffer/latch associated with the EPROM array.

FIG. 8 shows a logic diagram of a representative one of the eleven address buffer/latches associated with the EPROM array. Line 130 represents one of the address bus lines and is coupled to the address buffer/latch through either transmission gate 111, which is enabled by signal LENB, or by transmission gate 132, which is enabled by the $\overline{\text{PLE}}$ signal. $\overline{\text{PLE}}$ is normally high during EPROM read operations, but is low during a programming operation, so an address signal is transmitted into the address buffer/latch only when LENB is high during a programming operation.

The data buffer comprises inverters 133 and 134 coupled in a feedback arrangement. The data buffer/latch also comprises inverters 135-137, connected in a push-pull arrangement for higher speed operation, and depletion mode gates 138 and 139 both enabled by the $\overline{\text{PGE}}$ signal. Connected to the source of gate 138 is a pull-up depletion mode device 141 whose source is connected to line 144 and whose drain is connected to the source of another depletion mode gate 140. The gate and drain of device 140 are connected to $V_{PP}$. Depletion mode devices 142 and 143 are connected in a similar arrangement to devices 140 and 141, the gate and source of device 143 being connected to line 145. Line 144 transmits the true state of the particular address bit $\overline{A_i}$ which is latched, and line 145 transmits the inverse $A_i$ of the latched address bit. Lines 144 and 145 are both high voltage lines during the programming mode.

EPROM Word Line Decoding Circuitry

Figures 9, 14:
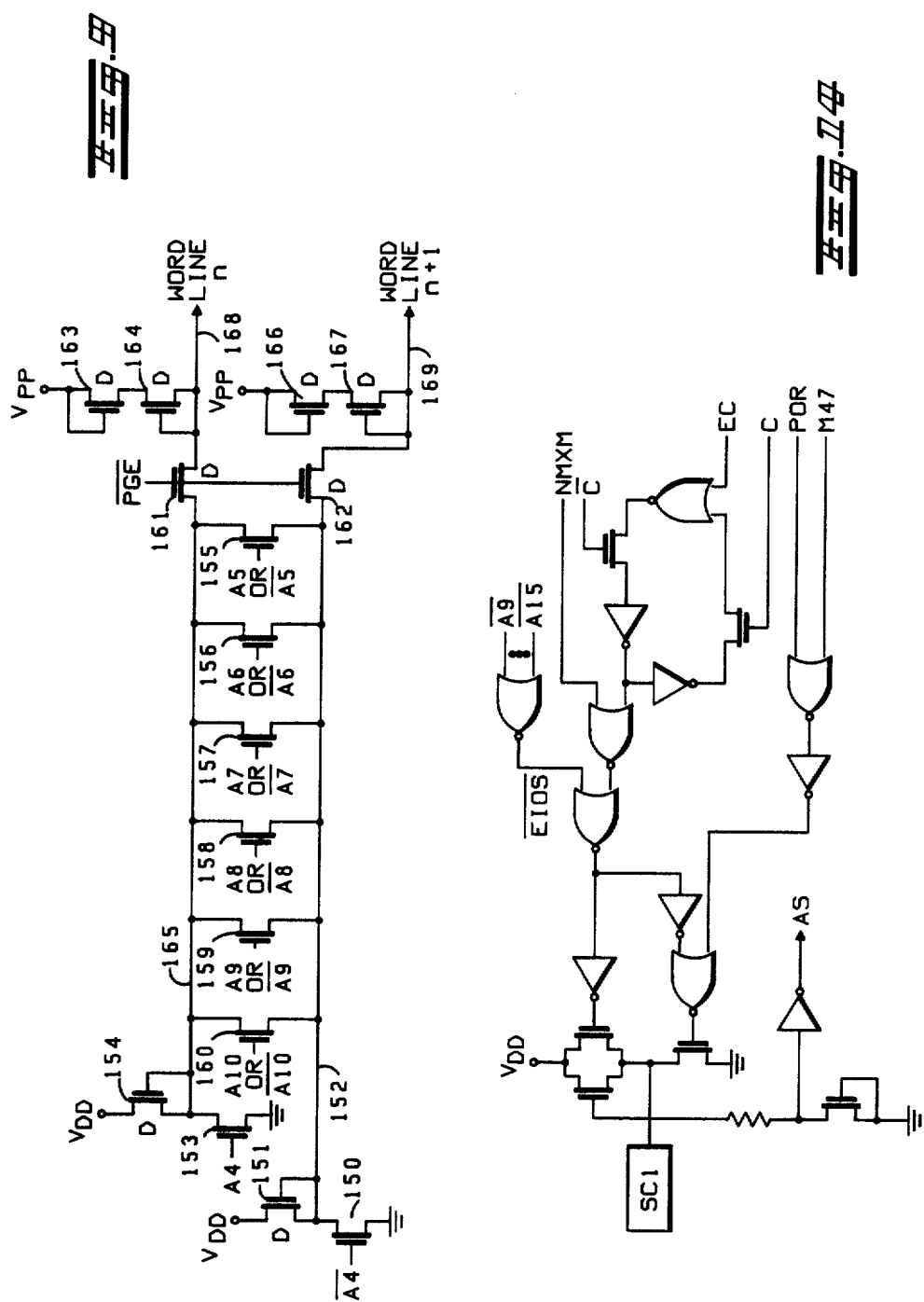
FIG. 9 shows a circuit diagram of the EPROM word line decoder.
FIG. 14 shows a logic diagram of the strobe control 1 buffer circuit for generating an address strobe (AS) signal.

FIG. 9 shows a circuit diagram of a representative one of the EPROM word line decoders, of which there are 64 in the preferred embodiment, each generating a true and complement output. The word line decoder shown in FIG. 9 comprises gates 153 and 150 which are responsive to address bits A4 and $\overline{A4}$, respectively. A depletion mode device 151 has its drain connected to $V_{DD}$ and its gate and source connected to the drain of device 150 as well as to line 152. A depletion mode device 154 has its drain connected to $V_{DD}$ and its gate and source connected to the drain of device 153 and to line 165. Devices 155-160 each have their drains connected to line 165 and their sources connected to line 152. The gates of devices 155-160 are connected to a particular combination of address bits A5-A10, respectively. The $2^6$ possible combinations of the six address bits A5-A10 give 64 different word line decoders. The word line decoder shown in FIG. 9 also comprises a depletion mode transmission gate 161 whose drain is connected to line 165, whose source is connected to line 168, and whose gate is controlled by signal $\overline{PGE}$. Another depletion mode transmission gate 162 has its drain connected to line 152, its source connected to line 169, and its gate controlled by signal $\overline{PGE}$. Line 168, representing wor line n, is connected to the gate and source of depletion mode device 164, whose drain is connected to the source of depletion mode device 163. The gate and drain of depletion mode device 163 are connected to $V_{PP}$. Line 169, representing word line n+1, is connected to the gate and source of depletion mode device 167, whose drain is connected to the source of depletion mode device 166. The gate and drain of depletion mode device 166 are connected to $V_{PP}$. Lines 168 and 169 are both high voltage lines during the programming mode.

EPROM Column Decoding Circuitry

Figure 10A:
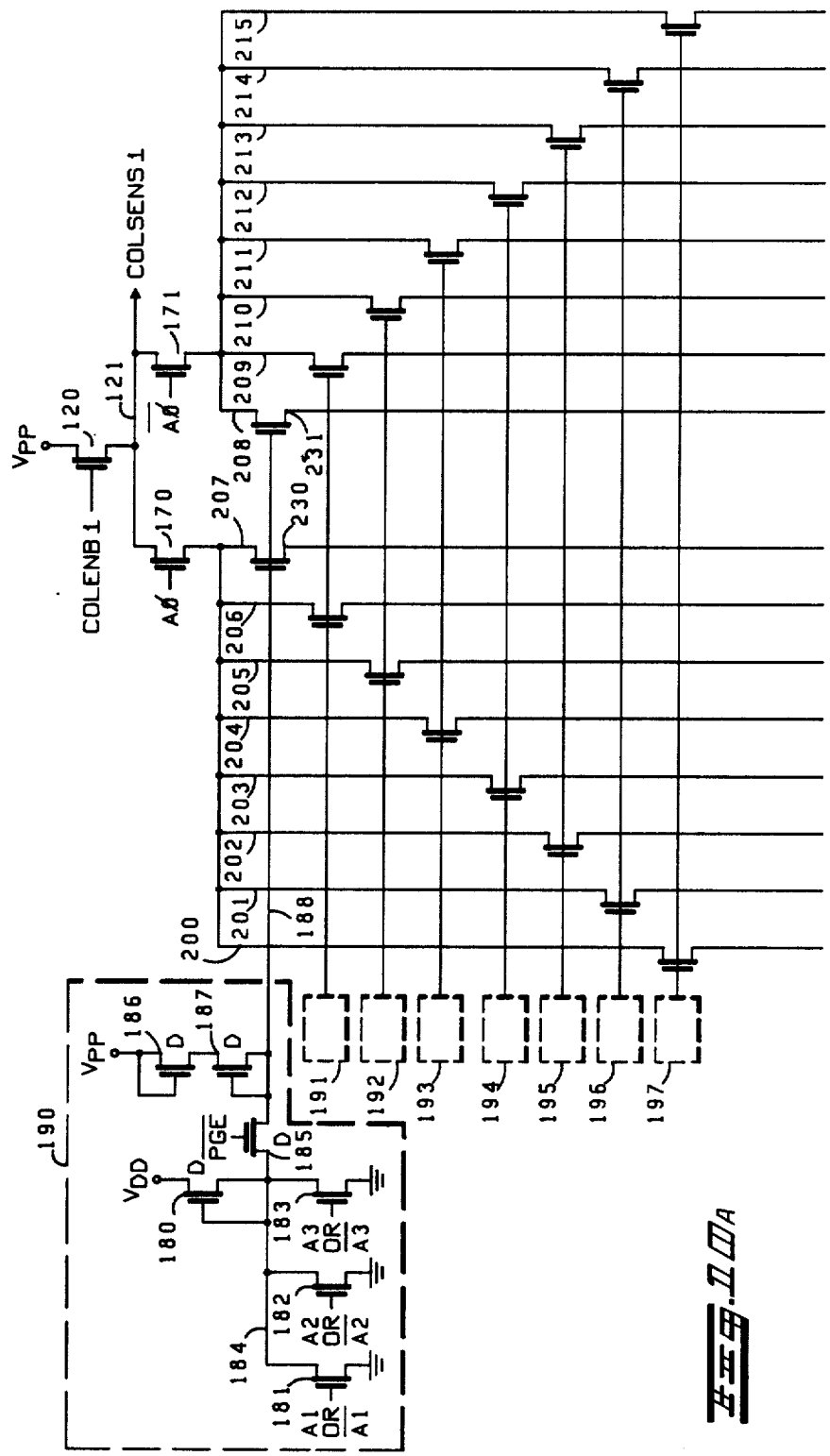
FIGS. 10A and 10B together show a circuit diagram of a portion of the EPROM array, including a portion of the column decoding circuitry.
Figure 10B:
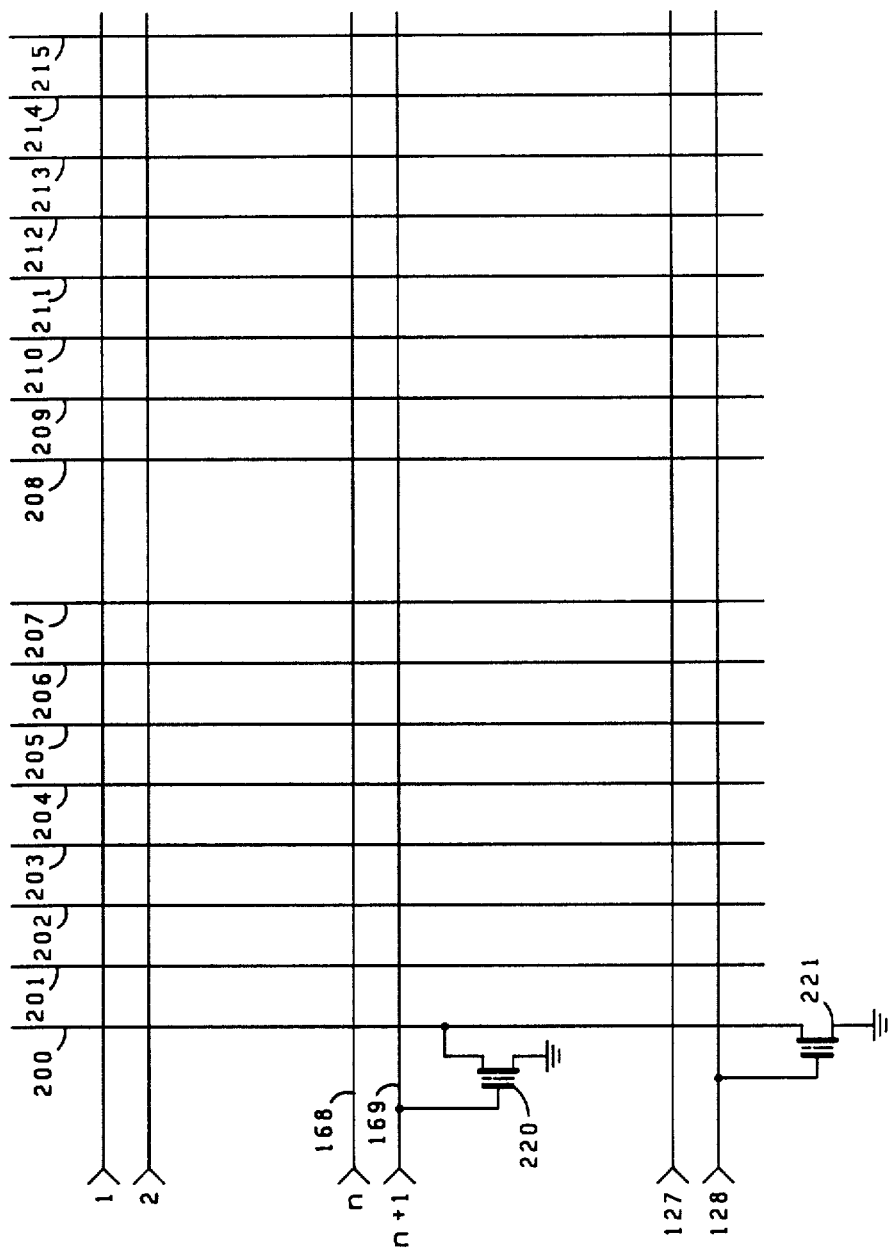

FIGS. 10A and 10B together show a circuit diagram of a portion of the EPROM column decoding circuitry. In FIG. 10A, lines 200-215 represent the 16 bit sense lines associated with one of the eight EPROM word columns. Bit sense lines 200-207 are enabled when the column enable signal (COLENBi) and address bit A0 are both high, and bit sense lines 208-215 are enabled when COLENBi is high and address bit $\overline{A0}$ is high. A particular one of eight column decoding circuits 190 shown in dashed out-line, is illustrated, the remaining column decoding circuits 191-197 being substantially identical to column decoding circuit 190. Each column decoding circuit, when selected, generates an output which enables a pair of bit sense lines in each word column. For example, circuit 190 generates an output, for an appropriate combination of address bits A1-A3, which renders transistors 230 and 231 conductive. It will be understood that an output signal generated over line 188 also renders conductive similarly situated pairs of transistors in the other seven word columns (not shown).

Column decoding circuit 190 comprises transistors 181-183 whose drains are connected to line 184 and whose sources are connected to ground. The gates of transistors 181-183 are connected to a particular combination of address bits A1-A3 or the complements thereof. For example, transistors 181-183 of circuit 190 may have their gates coupled to A1, A2, and A3, respectively. The corresponding transistors in circuit 191 may have their gates connected to A1, A2, and $\overline{A3}$, respectively, and so on, with the corresponding transistors in circuit 197 having their gates connected to $\overline{A1}$, $\overline{A2}$, and $\overline{A3}$, respectively.

Circuit 190 further comprises a depletion mode transistor 180 whose drain is connected to $V_{DD}$ and whose gate and source are connected to line 184. A depletion mode transistor 185 has its drain connected to line 184, its gate connected to signal $\overline{PGE}$, and its source connected to line 188. Line 188 is connected to the gate and source of a depletion mode transistor 187, whose drain is connected to the source of depletion mode transistor 186. Depletion mode transistor 186 has its gate and drain connected to $V_{PP}$.

The output COLSENSi of the word column shown in FIG. 10A is generated over line 121. Lines 121, 188, and 200-215 are all high voltage lines during the programming mode (and when properly selected).

FIG. 10B illustrates two representative storage cells 220 and 221 in the EPROM array proper. It will be understood that in the EPROM array a programmable transistor is located at every node (i.e., at the intersection of every bit sense line and word line). The programmable transistors such as transistors 220 and 221 in FIG. 10B have a floating gate, represented by a dashed line. When the EPROM is erased, as by exposure to ultraviolet radiation, the charge level on the floating gate is reduced, thereby lowering the threshold voltage of the transistor to approximately 2.0-2.5 volts. During the EPROM programming operation charge is injected into the floating gate of each transistor representing a stored binary 1, thereby increasing the threshold voltage to approximately 7 volts or greater. For those transistors representing a stored binary 0, no charge is injected into the floating gate.

Miscellaneous Circuitry

FIG. 11 shows a circuit diagram of a representative sense amp associated with a word column. There are eight sense amps, one for each word column. The sense amp of FIG. 11 receives as an input thereto the COLSENSi signal over line 121 and generates an output signal PDBi over line 240, assuming that the sense amp is enabled by signal ROMR. Referring to FIG. 12, signal ROMR is generated when signals RR, R/W and $\phi 2$ are all high. Signal RR is, in turn, generated when R/W is high, and the particular address on the microcomputer address bus represents an address within the EPROM address space (i.e., $F800-$FFFF).

FIGS. 13-21 represent various logic diagrams illustrating such portions of the microcomputer reset, strobe control, port 3 circuitry, and port 4 circuitry as to enable one skilled in the art to understand and practice the invention. Since these figures are not primarily directed to the core of the present invention, they will be discussed only in general terms.

Figure 13:
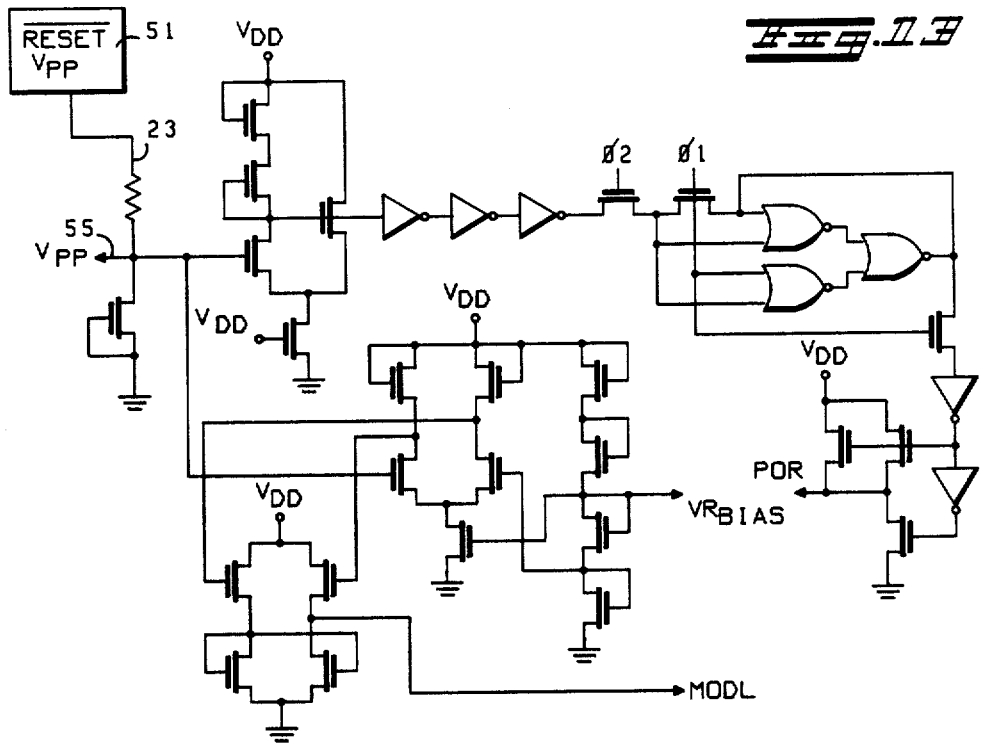
FIG. 13 shows a combined logic and circuit diagram of a portion of the $\overline{RESET}/V_{PP}$ circuit.

FIG. 13 shows a combined logic and circuit diagram of a portion of the reset circuit. $\overline{RESET}/V_{PP}$ 51 supplies either the $\overline{RESET}$ or programming potential $V_{PP}$ over line 23. The programming potential $V_{PP}$ is transmitted over line 55 to the appropriate portions of the circuitry shown in FIGS. 7-10 requiring $V_{PP}$. The circuit shown in FIG. 13 also generates POR (Power-On Reset), VRBIAS, and MODL signals. The VRBIAS and MODL signals are transmitted, among other places, to the port 2 circuitry shown in FIGS. 8G and 8H in the above-referenced Ser. No. 939,743.

FIG. 14 shows a logic diagram of the strobe control 1 buffer circuit for generating an address strobe (AS) signal. The AS signal enables the latching of valid addresses by latch 47 (FIG. 1) when port 3 is operating in the multiplexed address/data mode. The external memory/register select signal ($\overline{EIOS}$) in FIG. 14 represents an address decoding signal for memory locations $0100-$01FF.

Figure 24:
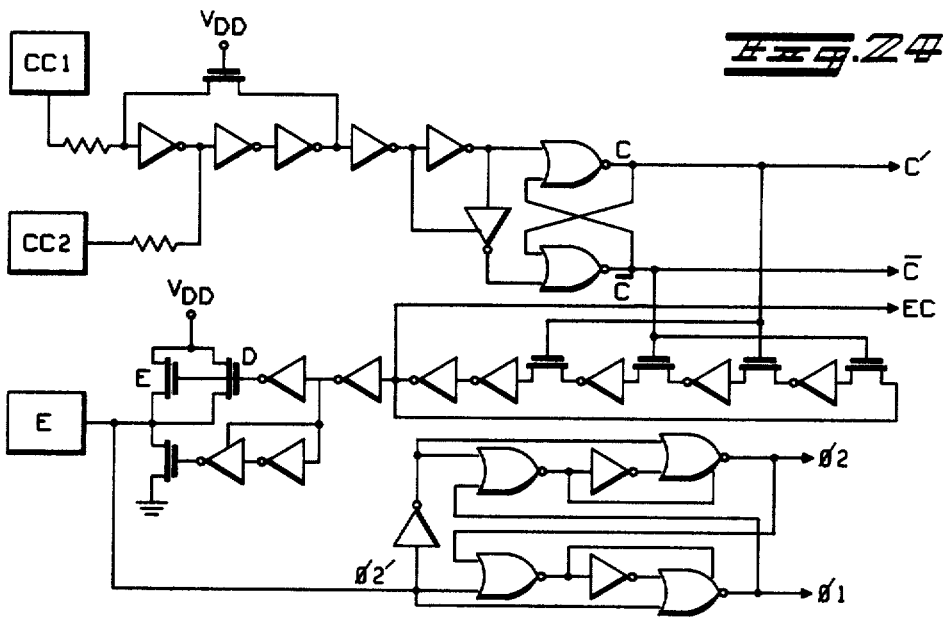
FIG. 24 shows a logic diagram illustrating the clock generating circuitry.

In FIG. 14 signals C and $\overline{C}$ represent a two-phase, non-overlapping clock provided by the crystal oscillator 31 using the clock circuitry shown in FIG. 24. The EC signal generated by the clock circuitry of FIG. 24, representing a logically true equivalent of the E signal, is used to force the AS signal low when signal E is high. The clock generator can also be driven by a TTL gate. The duty cycle of the TTL signal must be 50±10%, and its frequency should be four times the desired E frequency. In FIG. 14 the NMXM and M47 signals are provided by the circuitry of FIGS. 16 and 18, respectively.

Figure 15:
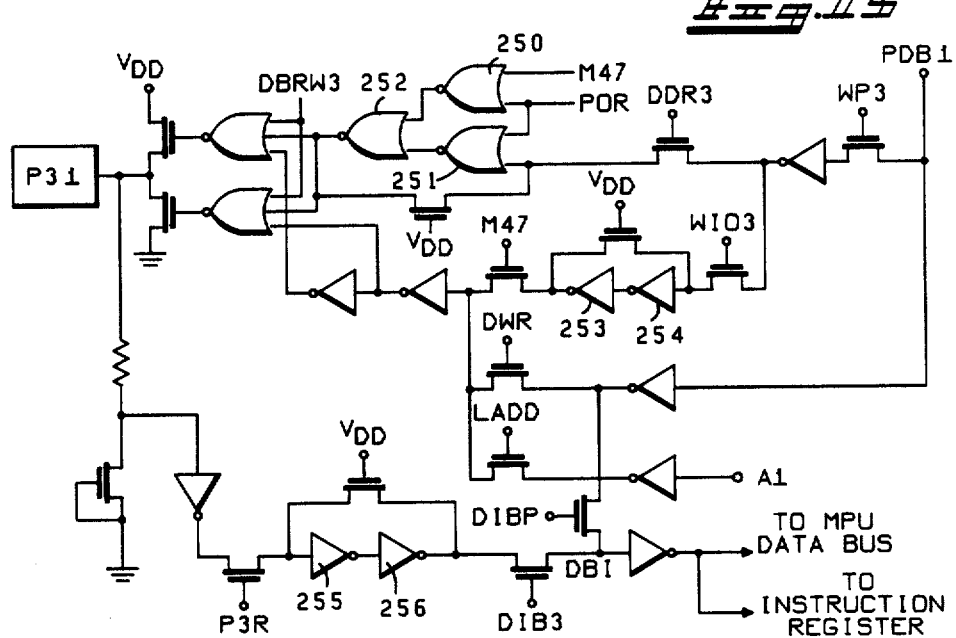
FIG. 15 shows a logic diagram of a representative one of the port 3 I/O buffers.

FIG. 15 shows a logic diagram of a representative one of the port 3 I/O buffers. Port 3 is a multifunctional 8-bit port that serves, depending upon the microcomputer mode, as an I/O port with handshake, as a data port, or as a multiplexed address and data port. Port 3 comprises two major functional blocks, including the I/O buffer circuitry shown in FIG. 15 and the control logic shown in FIGS. 18 and 19. In FIG. 15, NOR gates 250–252 form a data direction register. Inverters 253 and 254, connected in a feedback arrangement, form an output data register. Inverters 255 and 256, also coupled in a feedback arrangement, form an input data register.

The control signals generated by the port 3 control logic will now be discussed. Signal M47 is a mode select signal for modes 4 and 7. Signal WP3 (write to port 3) is a signal which goes high to indicate an MPU write to either the output data register or the data direction register. Signal WI03 is a signal which, after a one-half cycle delay, goes high to indicate an MPU write to the output data register. Signal DD33 is a signal which after a one-half cycle delay, goes high to indicate an MPU write to the data direction register. Signal DIBP is a signal which couples the peripheral data bus (PDB) 60 to the internal data bus of the MPU during an MPU read operation whenever the MPU addresses internal memory or internal registers (i.e., addresses $0000-$001F, excluding the Port 3 data register at address $0006). Signal DIB3 is a signal which couples the data from the input data register of port 3 to the internal data bus of the MPU during an MPU read operation whenever DIBP is not active. Signal P3R is the port 3 input latch signal, and it is enabled by the latch enable bit (SR3) of the port 3 control/status register at location $000F. If this bit is cleared, P3R will stay high. If this bit is set, P3R will drop low on a negative transition of the input to the input strobe pin $\overline{IS3}$, thus latching the input data to port 3. In modes 4 and 7, known as the single-chip mode, pin SC1 becomes an input strobe pin $\overline{IS3}$ to indicate that valid data being input to port 3 is to be latched.

Single DBRW3 is a signal which controls the three-state input to the output drivers. Signal LADD is a control signal used to load the low byte addresses (A0–A7) into the port 3 output drivers. Signal DWR is a signal which couples the internal peripheral data bus (PDB) 60 into the port 3 output driver.

Figure 19:
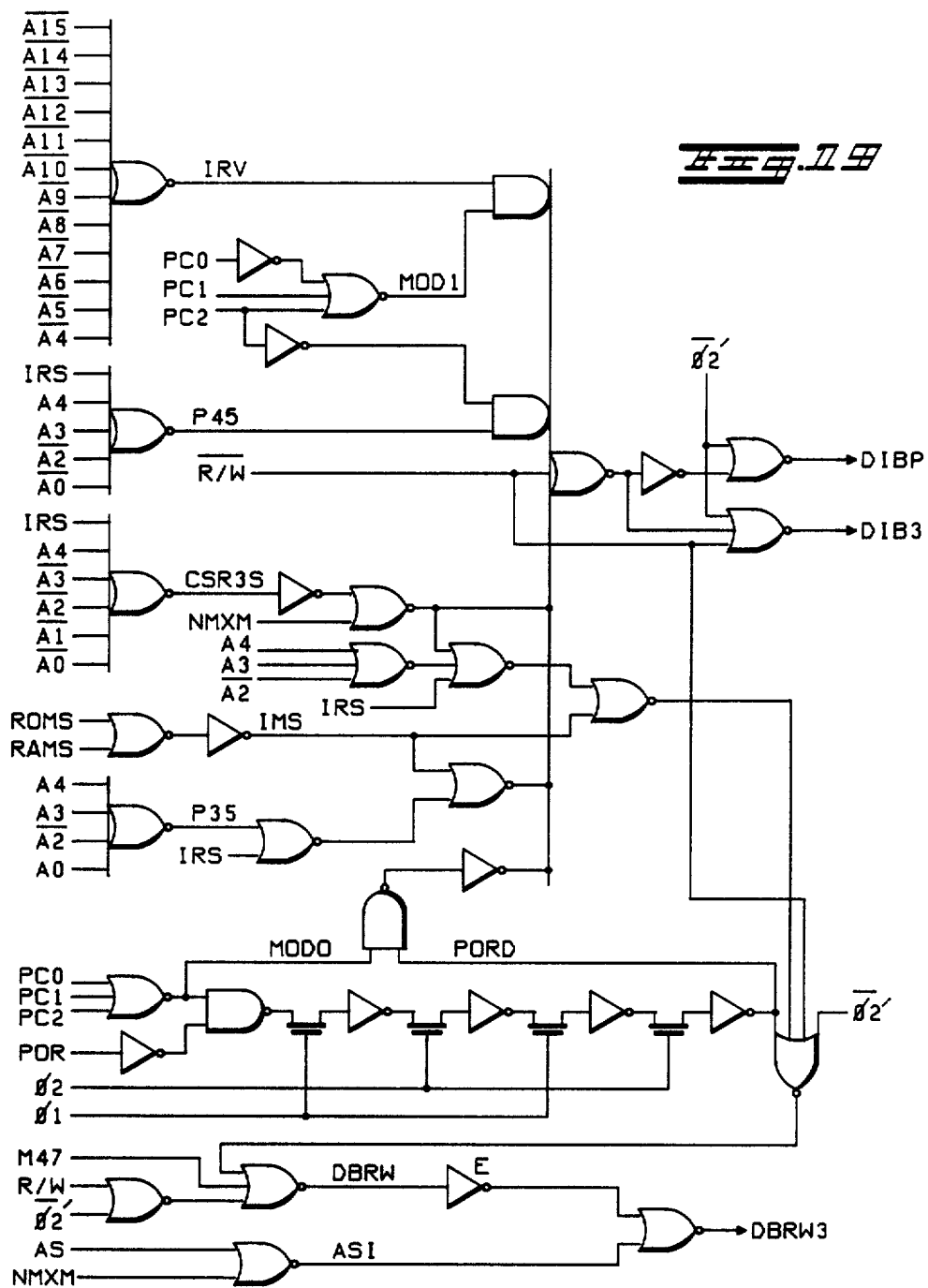

When port 3 is operated in mode 0 a two-cycle delay is added to the POR signal in the DBRW3 and DIBP logic of FIG. 19. The first two cycles after signal POR goes high, when the MPU is fetching the restart vector (addresses $FFFE and $FFFF), signal DBRW3 forces port 3 to be an input during E, and DIBP couples the external data into the MPU.

Figure 18:
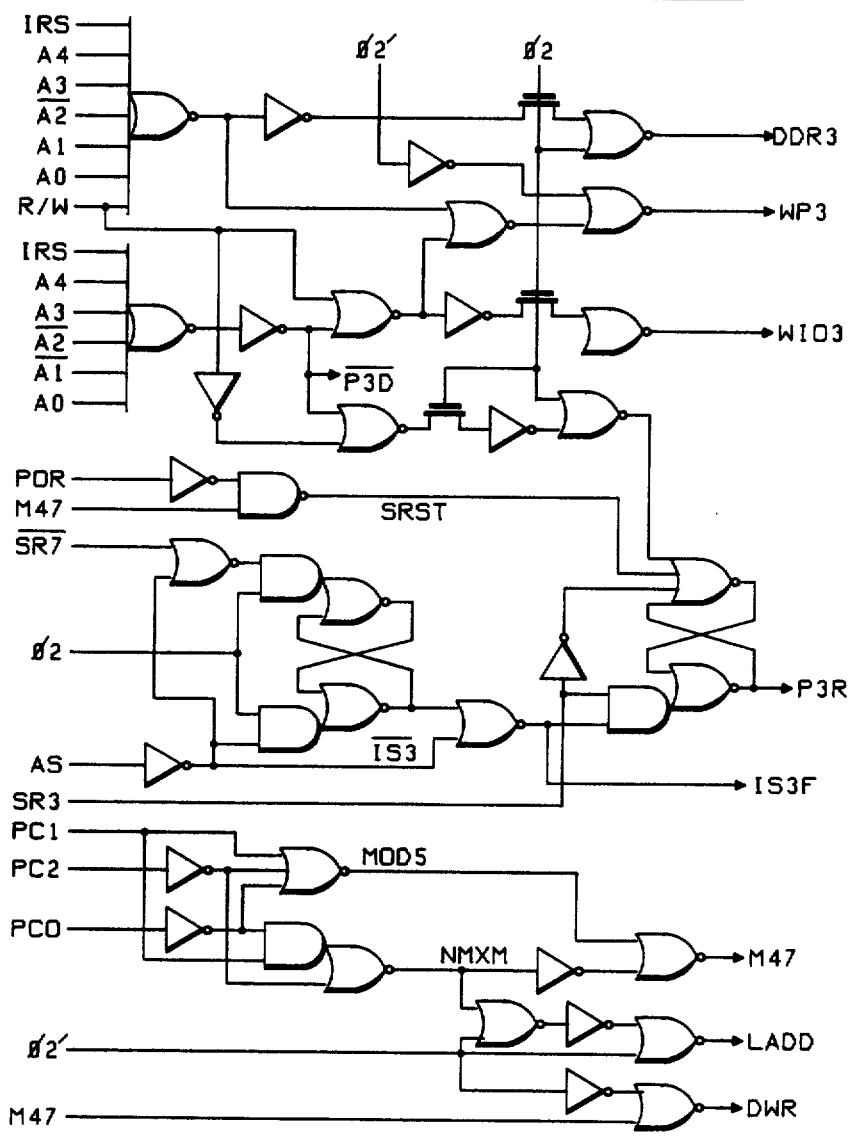
FIGS. 18 and 19 show logic diagrams illustrating the port 3 control logic.

In FIG. 18 the $\overline{IS7}$ signal is the $\overline{IS3}$ flag bit. It is a read-only status bit which is stored in the port 3 control/status register which is set by the falling edge of the input strobe $\overline{IS3}$. It is cleared by a read of the port 3 status/control register, followed by either a read or write to port 3. It is also cleared by the POR signal.

In FIG. 19 the ROMS signal is the EPROM select signal, and the RAMS signal is the RAM select signal. These signals are generated by appropriate address decoding circuitry corresponding to the EPROM and RAM locations within the microcomputer address space.

Figure 16:
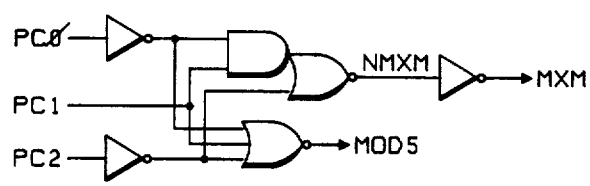
FIG. 16 shows a logic diagram for generating certain control signals used in the port 3 control logic.
Figure 20:
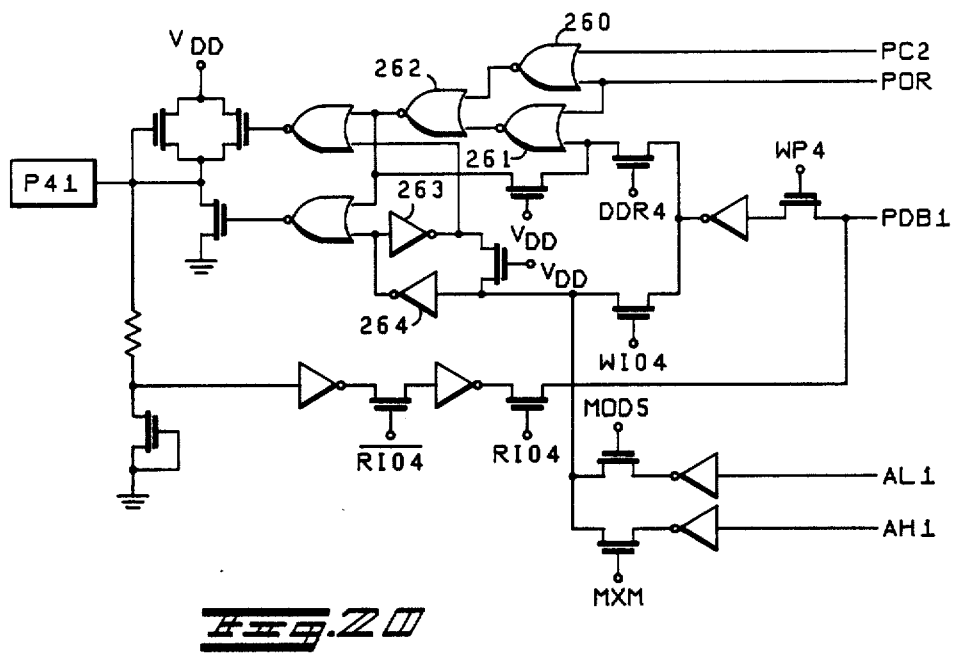
FIG. 20 shows a logic diagram illustrating a representative one of the port 4 I/O buffers.

FIG. 16 shows a logic diagram for generating the MXM and MOD5 control signals used in the port 4 I/O buffer circuit illustrated in FIG. 20. In FIG. 16 signals PC0–PC2 represent the mode control signals.

Figure 17:
FIG. 17 shows a logic diagram for generating a control signal used in the port 3 and port 4 control logic.

FIG. 17 shows a logic diagram for generating the internal register select (IRS) signal which is employed as a control signal in both the port 3 and the port 4 control logic. The IRS signal is low when an internal register within the address space $0000-$001F is selected for a read or write operation.

Figure 21:
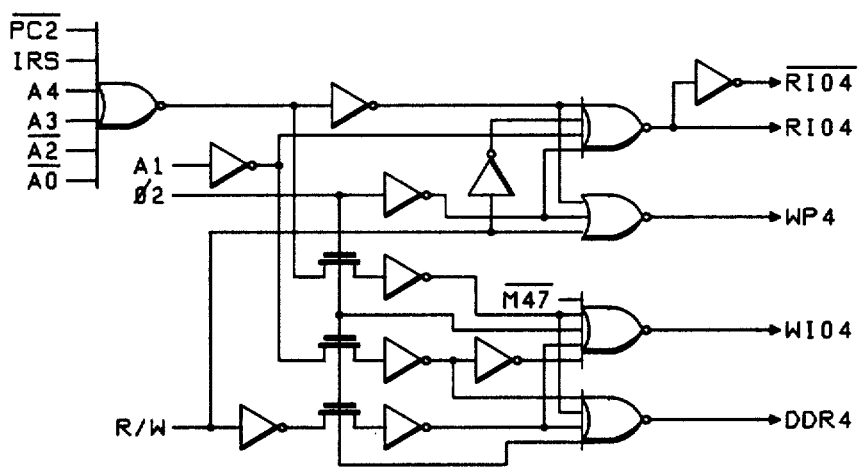
FIG. 21 shows a logic diagram illustrating a portion of the port 4 control logic.

FIG. 20 shows a logic diagram illustrating a representative one of the port 4 I/O buffer circuits, and FIG. 21 shows a logic diagram illustrating a portion of the port 4 control logic.

Port 4 is an 8-bit port that performs both I/O and address output functions depending upon the selected mode of operation. In mode 0, the EPROM programming mode, port 4 outputs the high byte addresses A8–A15. Port 4 comprises two major functional blocks, including the I/O buffer circuitry shown in FIG. 20 and the control logic circuitry shown in FIG. 21. The I/O buffer circuitry of FIG. 20 includes an output data register comprising inverters 263 and 264 coupled in a feed-back arrangement and a data direction register comprising NOR gates 260–262. The port 4 control logic generates a read signal RI04 and three write signals, WP4, DDR4, and WI04. Signal WP4 goes high during E whenever the MPU writes to either the output data register or the data direction register of port 4. Signal DDR4 goes high one-half cycle after the MPU writes to the data direction register of port 4. Signal WI04 goes high one-half cycle after the MPU writes to the output data register of port 4.

In mode 0, all bits in the port 4 data direction register are set, and port 4 is configured to output the high-order address bits A8–A15. All control signals, RI04, WP4, WI04, and DDR4 are inhibited and the high byte addresses are automatically connected to the output buffers via the output data register.

EPROM Programming Monitor

The programming monitor attached hereto as Appendix I is a computer program which is used to control the CPU 1 of microcomputer 30 to program the EPROM 3. In the preferred embodiment the programming monitor is resident in external ROM 40, within address space $B800-$BFFF of the microcomputer, as shown in FIG. 23. It will be understood that the programming monitor per se does not constitute part of the present invention. However, it has been appended to the description of the present invention to enable one skilled in the art to better understand and practice the invention.

Under the control of the programming monitor, CPU 1 is capable of performing a large variety of programming and verifying functions. For example, the programming monitor includes commands which permit the user to load a program from an external source, such as external RAM 41, into the internal RAM 2 of microcomputer 30. Another command allows the user to verify that the program loaded into the internal RAM 2 was properly loaded. Additional commands permit the user to punch the program stored in the internal microcomputer memory onto tape, to examine and change data in a memory location, to calculate the proper offset for relative addressing, to examine and change data in the microcomputer special registers, to display blocks of memory, to change and display break points, to trace through the user's program, and so on.

The important commands relative to the present invention are the command for determining that the EPROM 3 has been properly erased prior to the programming operation, the command with which to declare the crystal frequency in order to provide the proper duration of application of the programming potential $V_{PP}$, the command to program the EPROM 3 with the desired data, and finally the command to verify that the data loaded into the EPROM 3 is correct.

Regarding the command for determining whether the EPRO 3 is in an erased state, reference may be made to that portion of the programming monitor beginning at line 01345. The EPROM checking command is in the form: CHCK (AAAA) (BBBB), where AAAA and BBBB represent the beginning and ending addresses of the portion of the EPROM which it is desired to check. If any EPROM location is determined to be non-erased, an error print routine is used to identify such location to the user.

The crystal frequency determining command is set forth beginning on line 01539 of the program monitor. The user must identify the crystal frequency as either 2.45 or 4.91 MHz, in order for the programming circuit associated with the EPROM to supply the $V_{PP}$ potential to the EPROM for a duration of 50 sec.

The EPROM programming command is set forth beginning on line 01420 of the program monitor and is of the form: PROG (XXXX) (YYYY) (AAAA), where XXXX and YYYY are non-EPROM addresses within the microcomputer address space and wherein AAAA is the desired beginning EPROM address. This program segment of the programming monitor checks that the beginning EPROM address is a valid EPROM address. It also checks to be sure that the number of bytes of data to be programmed into the EPROM will fit into that portion of the EPROM beginning at the designated EPROM address. The EPROM programming routine also verifies that the EPROM section to be programmed is properly erased. The addresses of any non-zero bytes within the EPROM are printed out with the values at such addresses, as for the CHCK command discussed above. The user is given an option of proceeding with EPROM programming even though the EPROM memory is not clear. Next the user is instructed to turn on the 25 volt programming potential by closing switch 86 (FIG. 22), thereby applying $V_{PP}$ to the $\overline{RESET}/V_{PP}$ pin. The EPROM is then programmed in the manner to be discussed in further detail below. Next the user is requested to disconnect the $V_{PP}$ potential. Finally, using the verify command set forth beginning at line 01519 of the programming monitor, the programmed contents of the EPROM are compared for accuracy against the source of the data which was loaded into the EPROM.

The verify command has the form: VERF (XXXX) (YYYY) (AAAA), where the variables have the same meaning as for the PROG command described above. If an error is found during the verification operation, the address at which the error is found is printed along with the EPROM contents at such address and the memory contents which failed to be properly loaded.

In the preferred embodiment, EPROM 3 may be programmed with data from either the external RAM 41 or with data entered directly from terminal 33. However, it will be understood that, through appropriate peripheral equipment and interfaces, data may be loaded into EPROM 3 from a variety of other data sources.

Operation of Preferred Embodiment

Before proceeding with a description of the operation of the preferred embodiment, it should be mentioned that the memory map for the processor interrupt vectors in mode 0 is changed to $BFF0-$BFFF from $FFF0-$FFFF. Since $BFF0-$BFFF is located in external RAM or ROM memory space, when CPU 1 is reset in mode 0 viable interrupt vectors will exist, despite the microcomputer EPROM 3 having been erased. The external interrupt vectors are associated with a computer program (e.g., the programming monitor) which is stored in external memory space and is used by the CPU 1 to control the programming of EPROM 3.

When EPROM 3 has been erased, as by exposure to ultraviolet light, all of its floating gate transistors, each representing a data bit in the memory array, have no charge on their gates, so that in effect each EPROM data bit is in the 0 state. It is desired to effectively program 1's into certain bit locations, and this is accomplished in a well-known manner by applying the programming potential $V_{PP}$ to the gates of those transistors which are to represent binary 1's. The manner by which the EPROM floating gate transistors are programmed in the present invention will now be described.

To initiate the EPROM programming operation, the user closes switch 85 (FIG. 22), which pulls pins P20–P22 essentially to ground, causing mode selection signals PC0–PC2 each to be 0, representing mode 0. At the same time the potential on the $\overline{RESET}/V_{PP}$ pin is drawn towards ground, causing microcomputer 30 to go into reset. The mode 0 reset vector is fetched from addresses $BFFE and $BFFF, which allow the external computer program stored in external ROM 40 to be used by CPU 1 to program the EPROM 3. As previously mentioned, the external computer program may be of the type set forth in Appendix I.

After performing a check to determine whether all storage locations in EPROM 3 have been erased, an instruction in the EPROM programming monitor sets the appropriate program latch enable ($\overline{PLE}$) bit to 0 in the EPROM control register (FIG. 5). This conditions the EPROM 3 for programming by permitting address and data information to be latched in the address buffer/latch 61 and data latch 62 (FIG. 4), respectively, when the R/$\overline{W}$ signal is low and $\phi 2'$ is high. Next the programming monitor instructs the terminal printer to print a message to the user requesting him to turn on the programming potential $V_{PP}$. The user closes switch 86 (FIG. 22) to apply 25 volts to the $\overline{RESET}/V_{PP}$ pin from where $V_{PP}$ is distributed as required to the EPROM programmnng circuitry shown in FIGS. 9, 10A, 10B and 11. The EPROM 3 is now ready for programming at the desired locations. The EPROM may be programmed at locations which are either continuous or non-continuous and may be loaded in either a sequential or random manner. It will be understood that valid data may not be read from the EPROM when the 25 volt programming potential is connected to the $\overline{RE}$ $\overline{SET}/V_{PP}$ pin.

To program data into a particular address into the EPROM, the address and associated data are latched into the address buffer/latch 61 and data latch 62, respectively, shown in FIG. 4. The data latch is shown in greater detail in FIG. 7, and the address buffer/latch is shown in FIG. 8. As seen in FIGS. 7 and 10A, when the program enable signal ($\overline{PGE}$) is set to 0 for a 50 msec duration by CPU 1 under control of the programming monitor, a binary 1 stored in a particular data latch-/buffer such as shown in FIG. 7 will cause signal COLENBi to go high, thereby enabling its associated column select circuitry (FIG. 10A) by allowing $V_{PP}$ to conduct through transistor 120 to line 121. A particular one of the bit sense lines 200-215 in FIG. 10A will be enabled by the particular combination of address bits A1-A3 and their complements when signal $\overline{PGE}$ is low. For example, if the gates of transistors 181-183 in column decoder 190 of FIG. 10A are each connected to the true outputs A1-A3 of the appropriate address buffer/latches, and if address bits A1-A3 for a given address on address bus 56 are each 0, none of transistors 111-183 will be conductive, and the potential at the source of transistor 185 will be essentially $V_{DD}$. If signal $\overline{PGE}$ is high, potential $V_{PP}$ will conduct through depletion transistors 186, 187 and 185 to $V_{DD}$, and transistors 230 and 231 will not be enabled. If signal $\overline{PGE}$ is low, depletion device 185 will be turned off, and potential $V_{PP}$ will be transmitted over line 188 to devices 230 and 231. If signal $\overline{PGE}$ is low, and any of address bits A1-A3 are high, causing any of transistors 181-183 to be turned on, the potential at the source of device 185 will be substantially ground, and device 185 will be conductive since it is a depletion device and is conductive when its gate-to-source potential is 0 or higher. Consequently neither transistors 230 or 231 will be turned on for this condition.

Similarly, regarding the word line decoder shown in FIG. 9, when signal $\overline{PGE}$ is high, potential $V_{PP}$ conducts through transistors 161 and 162 to potential $V_{DD}$ or to ground, depending upon whether address bit A4 is low or high. When signal $\overline{PGE}$ is low, and transistor 153 is not enabled (i.e., address bit A4 is low), potential $V_{PP}$ will be transmitted over line 168, assuming that none of transistors 155-158 have turned on. If any of transistors 155-160 are conductive, the source of transistor 161 will be substantially 0, since transistor 150 is conductive, and depletion transistor 161 will be conductive since its gate-to-source potential is approximately 0, causing $V_{PP}$ to shunt to ground.

Regarding the address buffer/latch shown in FIG. 8, when signal $\overline{PGE}$ is high, VPP conducts through transistors 138 and 139 to the $V_{DD}$ potentials associated with inverters 136 and 137. When signal $\overline{PGE}$ goes low, if the output of inverter 136 is high, the gate-to-source potential of depletion transistor 138 is negative, causing such transistor to become non-conductive, and $V_{PP}$ is transmitted on line 144. Since for this condition the output of inverter 137 is low, depletion transistor 139 will remain conductive, and $V_{PP}$ will be conducted to $V_{DD}$, causing line 145 to remain low.

When signal $\overline{PGE}$ goes low for a 50 msec duration, the programming potential $V_{PP}$ is applied to all of the gates of the floating gate transistors in the particular word line which is selected by the appropriate combination of address bits A4-A10. For example, if the word line decoder shown in FIG. 9 is selected by the appropriate combination of address bits A4-A10, causing word line n+1 to transmit $V_{PP}$ over line 169, the gate of transistor 220 in FIG. 10B will rise to the programming potential, as will the gates of all other transistors similarly situated at the intersections of line 169 and all of the 128 bit sense lines, of which only lines 200-215, representing the bit sense lines of one column, are shown in FIG. 10B. Only floating gate transistors 220 and 221 are illustrated in FIG. 10B, but it will be understood by one skilled in the art that a floating gate transistor is situated at each of the intersections of the word lines 1-128 and the 128 bit sense lines.

Depending upon the particular address of the EPROM location which is being programmed, one of the bit sense lines in each column of the EPROM array will be enabled when either transistors 170 or 171 is rendered conductive and when one of the column decoders 190-197 generates an output in response to the appropriate combination of address bits A1-A3. Programming potential $V_{PP}$ is then transmitted through transistor 120, through transistor 170 or transistor 171, and through the particular transistors enabled by one of the column decoders 190-197, causing $V_{PP}$ to be applied to the drain of the floating gate transistor at the intersection of the selected word line, e.g., transistor 220 at the intersection of lines 169 and 200. By the avalanche injection of charge onto the floating gate of such transistor, the threshold voltage of the transistor is increased to greater than 7 volts. Thus, if the data input latch shown in FIG. 7 represents the data input latch associated with the least significant data bit, and the column shown in FIG. 10A is also associated with the least significant data bit, a binary 1 latched into the data latch of FIG. 7 will cause the address-selected floating gate transistor (e.g., floating gate transistor 220) to be programmed as a binary 1 also. If the least significant bit were a binary 0, the column enable signal (COLENB 1) would not be generated by the data input latch of FIG. 7, and the address-selected floating gate transistor would not have a charge injected into its floating gate, since $V_{PP}$ would not be transmitted through gate 120 of the column select circuit of FIG. 10A, and this transistor would store a binary 0. This completes the description of the EPROM programming operation.

Upon conclusion of the EPROM programming operation, $V_{PP}$ is reset to 5 volts from 25 volts, and an instruction in the EPROM programming monitor sets $\overline{PLE}$ high again to allow normal read operation of the EPROM 3. During an EPROM read operation, if the floating gate transistor at the intersection of a selected word line (e.g., word line n+1) and a selected bit sense line in a particular column (e.g., sense line 200) is storing a binary 1, such transistor (i.e., transistor 220) will fail to turn on since its threshold voltage is greater than 7 volts. $V_{PP}$ is 5 volts during normal read operations, and will be transmitted over line 121 to inverters 271 and 272 of the sense amp shown in FIG. 11, each of which generates a low output to gates 275 and 274, respectively. Depletion mode transistor 276 transmits a high output to inverter 277, which in turn transmits a low output to inverter 278. Gate 280 conducts $V_{DD}$ through gate 282 (assuming gate 28 has been turned on by the ROM read signal ROMR), and accordingly a binary 1 is transmitted over peripheral data bus line 240. In the event the address-selected, programmed floating gate transistor 220 is storing a binary 0, $V_{PP}$ is shunted to ground through gate 220, since its threshold voltage remains at 2.0-2.5 volts. The output of inverter 272 goes high, causing transistor 274 to conduct $V_{DD}$ through depletion mode transistor 276 to ground. The output of inverter 277 goes high, permitting $V_{DD}$ to be conducted through depletion mode transistor 281 to ground. The output of the corresponding peripheral data bus line 240 thus represents a binary 0 for this condition.

The timer 4 of microcomputer 30 which is utilized to set the program enable signal $\overline{PGE}$ low for a 50 msec duration may be of the type shown and described in the above-referenced Ser. No. 945,737. The referenced case discloses a timer readable by the central processing unit the same manner in which CPU 1 of the present invention may read timer 4.

It will be understood that switches S1 and S2 in FIG. 22 may be electrically operated in response to control signals from microcomputer 30 under the direction of the external computer program.

It will be appreciated that the present invention results in substantial cost savings to the user, since the on-board processor of the single-chip microcomputer is used to program the EPROM of the microcomputer. It is therefore unnecessary to utilize a separate processor. In addition, the present invention eliminates the necessity of providing pins dedicated solely to the EPROM programming operation, and these pins can be used to advantage to provide other capabilities in the microcomputer.

It will be apparent to those skilled in the art that the disclosed Microcomputer With MPU-Programmable EPROM may be modified in numerous ways and may assume many embodiments other that that specifically set out and described above. Accordingly, it is intended by the appended claims to cover all modifications of the invention which fall within the true spirit and scope of the invention.

APPENDIX I

PROBUG * MC6876. EPROM PROGRAMMER & MONITOR *

```
00001           OPT   Z01,LLEN=80
00002           NAM   PROBUG
00003           TTL   *** MC68701 EPROM PROGRAMMER & MONITOR ***

00005           * * * * * * * * * * * * * * * * * * * *
00006           *                                     *
00007           * * * *         P R O B U G     * * * *
00008           *                                     *
00009           *              M O T O R O L A        *
00010           *           A U S T I N < T E X A S   *
00011           * * * * * * * * * * * * * * * * * * * *

00013           *************************************
00014           * ALTHOUGH THE INFORMATION CONTAINED HEREIN, AS WELL
00015           * AS ANY INFORMATION PROVIDED RELATIVE THERETO, HAS
00016           * BEEN CAREFULLY REVIEWED AND IS BELIEVED ACCURATE,
00017           * MOTOROLA ASSUMES NO LIABILITY ARISING OUT OF ITS
00018           * APPLICATION OR USE, NEITHER DOES IT CONVEY ANY LICENSE
00019           * UNDER ITS PATENT RIGHTS NOR THE RIGHTS OF OTHERS.
00020           *************************************

00022           * COPYRIGHT (C) MOTOROLA, INC., 1979
```

```
00067    00024         ************** COMMANDS **************
00068    00025         * L    LOAD A PROGRAM FROM TAPE
00069    00026         * L <OFFSET> LOAD FROM TAPE WITH OFFSET, SAVE OFFSET
00070    00027         * V    VERIFY THAT A PROGRAM HAS PROPERLY LOADED
00071    00028         * V <OFFSET>  VERIFY PROGRAM LOADED WITH AN OFFSET
00072    00029         * D X,Y DISPLAY MEMORY FROM X TO Y
00073    00030         * P X,Y PUNCH CONTENTS OF MEMORY FROM X TO Y
00074    00031         * CHCK A,B CHECK FOR ERASED STATE (ALL 0) IN EPROM
00075    00032         *           FROM ADDRESS A TO B
00076    00033         * PROG X,Y,A PROGRAM THE EPROM USING DATA FROM
00077    00034         *           MEMORY LOCATIONS X TO Y STARTING AT
00078    00035         *           EPROM ADDRESS A
00079    00036         * VERF X,Y,A VERIFY THE EPROM USING DATA FROM
00080    00037         *           MEMORY LOCATIONS X TO Y STARTING AT
00081    00038         *           EPROM ADDRESS A
00082    00039         * XTAL EXAMINE/CHANGE THE CURRENT XTAL PARAMETER
00083    00040         * M X   MEMORY EXAMINE/MODIFY
00084    00041         *      <DATA> CHANGE 1 BYTE IN MEMORY TO <DATA>
00085    00042         *       LF   INCR POINTER, PR ADR AND VALUE OF NEW PNTR
00086    00043         *       SP   INCR PNTR, PR NEW VALUE ON SAME LINE
00087    00044         *       ,    INCR PNTR, NO PR OF ADR OR VALUE
00088    00045         *       UA   DECR PNTR, PR ADR AND VALUE AT PNTR
00089    00046         *       /    PR ADR AND VALUE OF CURRENT PNTR
         00047         *       CR   END MEMORY EXAMINE COMMAND
00091    00048         * X/ SAME AS M X, X MUST START W/ 0-9, MAY NEED LEADING
00092    00049         * /     PR ADR AND VALUE OF LOC LAST REF WITH MEM/EXAM
00093A 00D 00050       * O X Y CALCULATE RELATIVE OFFSET FOR BRANCH INSTR
00094A 00D 00051       * B DISPLAY BREAKPOINT
00095A 00D 00052       * B- REMOVE BREAKPOINT
00096A 00D 00053       * B X SET BREAKPOINT
00097A 00D 00054       * G X EXECUTE USER PROG STARTING AT ADR X
         00055         * G   EXECUTE USER PROG STARTING AT CURRENT PC
00099A 00E 00056       * R   DISPLAY/CHANGE USER'S PROGRAM REGS
00100    00057         * .   TRACE 1 INSTRUCTION
00101A 00E 00058       * T X TRACE X INSTRUCTIONS
00102A 00E 00059       * C EXECUTE USER'S CODE AS SUBR, RTS TO MONITOR
00103    00060         * C X XQT USER'S CODE AS SUBR START AT ADR X
00104    00061         * HI SET HIGH SPEED - 120 CPS FOR ON-CHIP IO
00105A 00E 00062       * HY SET HIGHER YET SPEED, FOR CRT - 9600 BD
00106A 00E 00063       * CONTROL X - TERMINATE D OR T PRINT
00107A 00E 00064       * CONTROL W - WAIT DURING D OR T PRT, ANY CHAR
00108A 00E 00065       *             CAUSES CONTINUATION OF PRINT
00109A 00E
00110
00111A 00E
00112A 00E
00113A 00E
00114A 00F
00115A 00F
00116A 00F
00117A 00F
00118
00119A 00F
00120A 00F
00121A 00F
00122A 00F
00123A 00F

00067                 * CONTROL CHARACTERS RECOGNIZED DURING PRINT
00068    0017 A CNTLW  EQU    $17    WAIT CHARACTER
00069    0018 A CNTLX  EQU    $18    ABORT CHARACTER
00070                 * ON-CHIP CLOCK EQUATES
00071    0009 A CLOCK  EQU    $09    TIMER 1
00072    0008 A TCSR   EQU    $08    TIMER CONTROL STATUS REG
00073    000B A OCREG  EQU    $0B    OUTPUT COMPARE REG
00074                 * ON-CHIP IO EQUATES
00075    0010 A RMCR   EQU    $10    RATE & MODE CONTROL
00076    0011 A TRCS   EQU    $11    TRANSMIT/RECEIVE CNTRL STAT REG
00077    0012 A RECEV  EQU    $12    READ REG
00078    0014 A ECONR  EQU    $14    RAM & EPROM CNTRL REG
00079    0013 A TRANS  EQU    $13    TRANSMIT REG
00080    0001 A P2DDR  EQU    $01    PORT 2 DATA DIRECTION
00081                 * MODE SELECT WORD
00082    0003 A MODE   EQU    $03    UPPER 3 BITS = MODE
```

```
00083                    * PROGRAMMING WAIT TIMES FOR 2.45MHZ AND
00084                    * 4.91 MHZ XTALS
00085                    * WAIT TIME EQUALS :
00086                    * [(50 MSEC X CRYSTAL FREQ)/4] - 22
00087          0077   A  W2.45H  EQU   $77        HI BYTE OF W2.45
00088          77EA   A  W2.45   EQU   30698      2.45 MHZ XTAL
00089          EFEA   A  W4.91   EQU   61418      4.91MHZ XTAL

00091                    ************ RAM STORAGE ****************
00092          0080   A  LOWRAM  EQU   $80        USED FOR STK OVFLOW CHK
00093A 00D9                      ORG   $0D9
00094A 00D9    0001   A  STACK   RMB   1          STK PNTR WILL RUN UP TOWARD USER C
00095A 00DA    0002   A  WAITT   RMB   2          CYCLE DELAY TIME
00096A 00DC    0002   A  IMBEG   RMB   2          MEMORY IMAGE BEGINNING
00097A 00DE    0002   A  IMEND   RMB   2          MEMORY IMAGE END 00099A 00E0    0001   A  CT      RMB   1          INPUT CHAR CT
00100          00E0   A  CKSUM   EQU   CT         USED BY LOAD/VERF
00101A 00E1    0002   A  STRTX   RMB   2          INPUT CHAR PTR (ON SATCK)
00102A 00E3    0002   A  NEXTX   RMB   2          NEXT TABLE PTR
00103                    * CHRNL - UPPER 6 BITS-# NULLS AFTER CR
00104                    *         LOW 2 BITS-# NULLS AFTER CHAR
00105A 00E5    0001   A  CHRNL   RMB   1          NUM NULLS AFTER CHAR
00106A 00E6    0001   A  BBLK    RMB   1          BULK STORE BLK + NXT 4 LOC
00107A 00E7    0002   A  PNTR    RMB   2          OPEN ADR
00108A 00E9    0002   A  TEMPA   RMB   2
00109A 00EB    0001   A  TEMP    RMB   1
00110                    * TEMP AND OVFL MUST FOLLOW TEMPA
00111A 00EC    0001   A  OVFL    RMB   1          OVERFLOW FLAG
00112A 00ED    0002   A  SAVSTK  RMB   2          PC
00113A 00EF    0002   A          RMB   2          X
00114A 00F1    0001   A          RMB   1          A
00115A 00F2    0001   A          RMB   1          B
00116A 00F3    0001   A          RMB   1          CC
00117A 00F4    0002   A  SPSAVE  RMB   2          STK
00118          0001   A  NUMBP   EQU   1          NUMBER BRKPNTS
00119A 00F6    0002   A  BKADR   RMB   NUMBP*2    BRKPNT ADR
00120A 00F8    0001   A  OPCODE  RMB   NUMBP      CODE REPLACED
00121A 00F9    0001   A  BRKFLG  RMB   1          BRKPNT IN
00122A 00FA    0002   A  NTRACE  RMB   2          TRACE INSTR
00123A 00FC    0001   A  EXONE   RMB   1          XQT 1 INSTR 00124A 00FD    0001   A  VFLAG   RMB   1          VERIFY FLAG
00125A 00FE    0001   A  OUTSW   RMB   1          ECHO FLAG
00126A 00FF    0001   A  CALLF   RMB   1          FLAG FOR C CMD

00128                    ************ BEGINNING OF ROM ************
00129A B800              ORG    $B800

00132                    ********* COMMAND TABLE **********
00133                    *
00134                    * EACH ENTRY IN THE TABLE IS AS FOLLOWS:
00135                    *   FCB   XXX    XXX=TOTAL SIZE OF ENTRY
00136                    *   FCC   /STRING/  STRING IS THE INPUT STRING
00137                    *   FDB   ADDR      ADDR IS THE ROUTINE ADDRESS
00138                    *
00139                    * THE LAST ENTRY IS:
00140                    *   -2=END OF TABLE(S)
00141                    *
00142          B800   A  FCTABL  EQU   *
00143A B800    04     A          FCB   4
00144A B801    42     A          FCC   /B/
00145A B802    BB29   A          FDB   BRKPNT
00146A B804    04     A          FCB   4        *
00147A B805    43     A          FCC   /C/
00148A B806    BB54   A          FDB   CALL
00149A B808    04     A          FCB   4
00150A B809    44     A          FCC   /D/
00151A B80A    BC80   A          FDB   DISPLY
00152A B80C    04     A          FCB   4        *
00153A B80D    47     A          FCC   /G/
00154A B80E    BB56   A          FDB   GOXQT
00155A B810    04     A          FCB   4        *
00156A B811    4C     A          FCC   /L/
00157A B812    BD63   A          FDB   LOAD
00158A B814    04     A          FCB   4        *
00159A B815    4D     A          FCC   /M/      *
```

```
00160A B816   B9EB  A         FDB   MEMORY
00161A B818   04    A         FCB   4        *
00162A B819   4F    A         FCC   /O/
00163A B81A   BA43  A         FDB   OFFSET
00164A B81C   04    A         FCB   4        *
00165A B81D   50    A         FCC   /P/
00166A B81E   BD35  A         FDB   PUNCH
00167A B820   04    A         FCB   4        *
00168A B821   52    A         FCC   /R/
00169A B822   BAAF  A         FDB   REGSTR
00170A B824   05    A         FCB   5
00171A B825   48    A         FCC   /HI/
00172A B827   B8AD  A         FDB   S120
00173A B829   05    A         FCB   5
00174A B82A   48    A         FCC   /HY/
00175A B82C   B8B5  A         FDB   HY
00176A B82E   04    A         FCB   4
00177A B82F   54    A         FCC   /T/
00178A B830   BB8B  A         FDB   TRACE
00179A B832   04    A         FCB   4
00180A B833   56    A         FCC   /V/
00181A B834   BD74  A         FDB   VERF
00182A B836   07    A         FCB   7
00183A B837   43    A         FCC   /CHCK/
00184A B83B   BE2C  A         FDB   CHCK
00185A B83D   07    A         FCB   7
00186A B83E   50    A         FCC   /PROG/
00187A B842   BE9A  A         FDB   PGM
00188A B844   07    A         FCB   7
00189A B845   56    A         FCC   /VERF/
00190A B849   BF44  A         FDB   VFY
00191A B84B   07    A         FCB   7
00192A B84C   58    A         FCC   /XTAL/
00193A B850   BF70  A         FDB   XTL
00194A B852   FE    A         FCB   -2       *END OF TABLE

00196                         ************* INCHNP **************
00197                         * CALL IO ROUTINE W/ INDEX TO INPUT DATA
00198                         * CLEARS PARITY
00199                         * IGNORES RUBOUT CHAR
00200                         * ECHOES OUTPUT IF FLAG CLEAR
00201                         * SAVE, RESTORE REG B
00202A B853 37                INCHNP PSHB
00203A B854 8D 12 B868        INCH15 BSR    CIDTA     READ INPUT (KEYBOARD)
00204A B856 24 FC B854               BCC    INCH15    LOOP ON NO WAIT INPUT
00205A B858 84 7F    A                ANDA   #$7F      CLEAR PARITY
00206A B85A 27 F8 B854                BEQ    INCH15    IGNORE NULLS
00207A B85C 81 7F    A                CMPA   #$7F      RUBOUT?
00208A B85E 27 F4 B854                BEQ    INCH15
00209A B860 D6 FE    A                LDAB   OUTSW     CHK IF ECHO
00210A B862 26 02 B866                BNE    INCH4
00211A B864 8D 19 B87F                BSR    OUTCH     ECHO INPUT
00212A B866 33                INCH4  PULB
00213A B867 39                       RTS

00215                         ************ CIDTA ***************
00216                         * READ 1 CHAR FROM INPUT W/ NO WAIT
00217                         * RETURN W/ C CLEAR IF NO READ
00218                         *    ELSE REG A = INPUT & C IS SET
00219A B868 96 11    A         CIDTA LDAA   TRCS      GET CONTROL WORD
00220A B86A 48                       ASLA             CHK THAT RDRF IS SET
00221A B86B 25 03 B870                BCS    CIDTA1    READ DATA IF SET
00222A B86D 48                       ASLA             LOOK AT ERR BIT
00223A B86E 24 03 B873                BCC    CIDTA2    RTN W/C CLR IF NO READ
00224                         * IF FRAMING ERR OR OVER RUN-READ
00225A B870 96 12    A         CIDTA1 LDAA   RECEV     READ
00226                         * RETURN W/CARRY SET & LDAA BITS SET
00227A B872 0D                       SEC              FLAG READ-NO WAIT ACOMPLISHD
00228A B873 39                CIDTA2 RTS

00230                         ********** OUTCH **********
00231                         * OUTPUT CHAR FROM REG A
00232                         * OUTC - SUBR CALLED BY CODTA
00233                         * EXPECT 30 OR 120 CPS
00234                         * DEFAULT SPEED = 30 CPS
00235                         * PADS CR AND CHAR FOR 120
00236                         * PAD 4 NULLS IF PUNCH CR
```

```
00237A B874 37            OUTC    PSHB
00238A B875 D6 11      A  OUTC1   LDAB    TRCS      GET CONTRL WRD
00239A B877 C5 20      A          BITB    #$20      TDRE SET?

00240A B879 27 FA B875           BEQ     OUTC1     WAIT UNTIL IT IS
00241A B87B 97 13      A          STAA    TRANS
00242A B87D 33            CRTN    PULB
00243A B87E 39                    RTS

00245A B87F 37            OUTCH   PSHB
00246A B880 8D F2 B874            BSR     OUTC      OUTPUT CHAR
00247A B882 D6 FE      A          LDAB    OUTSW     GET TAPE FLAG
00248A B884 26 02 B888            BNE     N1
00249A B886 D6 E5      A          LDAB    CHRNL     NOT TAPE
00250A B888 81 0D      A  N1      CMPA    #$D       CR
00251A B88A 27 08 B894            BEQ     N3
00252A B88C 81 10      A          CMPA    #$10      NO PADDING IF DLE
00253A B88E 27 ED B87D            BEQ     CRTN
00254A B890 C4 03      A          ANDB    #$3       MASK OUT HIGH 6-BIT CNTR
00255A B892 20 02 B896            BRA     N4
00256A B894 54            N3      LSRB              REMOVE LOW 2-BIT CNTR
00257A B895 54                    LSRB
00258A B896 5A            N4      DECB              DECR NULL CNTR
00259A B897 2B E4 B87D            BMI     CRTN      EXIT IF ENOUGH NULLS
00260A B899 36                    PSHA
00261A B89A 4F                    CLRA
00262A B89B 8D D7 B874            BSR     OUTC      OUTPUT NULL
00263A B89D 32                    PULA
00264A B89E 20 F6 B896            BRA     N4        PR NXT NULL

00266                             ************* COON **************
00267                             * INITIALIZE OUTPUT DEVICE-SILENT 700 PRT
00268                             * TURN ON TI PRINTER
00269A B8A0 CE BFA0    A  COON    LDX     #PRTON    ACTIVATE ACD
00270A B8A3 BD BA96    A  COON2   JSR     PDATA1
00271                             * ENTRY FROM BSOFF FOR DELAY AFTER TURN OFF PUNCH
00272A B8A6 CE 411B    A  DELAY   LDX     #$411B    100 MS DELAY
00273A B8A9 09            DLY     DEX
00274A B8AA 26 FD B8A9            BNE     DLY
00275A B8AC 39                    RTS
00276                     *
00277                             ************* HY / HI *************
00278                             * HY & HI SET CHRNL FLAG FOR PADDING
00279                             * AND SET ON-CHIP SERIAL IO RMCR
00280                             * LOW 2 BITS = NUM NULLS AFTER CHAR
00281                             * HIGH 6 BITS = NUM NULLS AFTER CR

00283                             ************* HI **************
00284                             * SET SPEED FOR 120 CPS
00285                             * SET # NULLS TO PAD CHAR
00286                             * SET BITS FOR 1200 BAUD IN RMCR
00287A B8AD CC 4F06    A  S120    LDD     #$4F06
00288A B8B0 97 E5      A  S1205   STAA    CHRNL
00289A B8B2 D7 10      A          STAB    -RMCR     SET BAUD RATE
00290A B8B4 39                    RTS

00292                             ************* HY **************
00293                             * HIGHER YET - 9600 BAUD ON CRT
00294                             * SET PADDING TO ZERO
00295A B8B5 CC 0005    A  HY      LDD     #$0005    ALSO SET RMCR
00296A B8B8 20 F6 B8B0           BRA     S1205
00297                             ********** RESET **********

00298                             * COME HERE FOR MONITOR RESTART
00299                             * TURN ON CONSOLE
00300                             * PRINT MONITOR NAME
00301                             * INIT RAM USED BY MONITOR
00302                             * MASK I BIT IN USER CC
00303                             * SET INITIAL SPEED
00304                             * INIT HARDWARE TRACE DEVICE
00305A B8BA 8E 00C5    A  START   LDS     #STACK-20 RESET INCASE USER DIDN'T
00306A B8BD 9F F4      A          STS     SPSAVE    INIT USER STACK
00307A B8BF 8E 00D9    A          LDS     #STACK    RESET MONITOR STK
00308A B8C2 CE 00F6    A          LDX     #BKADR    INIT RAM TO 0
00309A B8C5 6F 00      A  CLRAM   CLR     0,X
00310A B8C7 08                    INX
00311A B8C8 8C 0100    A          CPX     #CALLF+1  END?
00312A B8CB 26 F8 B8C5           BNE     CLRAM
00313                             * INITIALIZE ON-CHIP SERIAL I/O
```

```
00314A B8CD CC 1007  A            LDD   #$1007      SET PADDING FOR 300
00315A B8D0 8D DE B8B0            BSR   S1205       SET RMCR
00316A B8D2 86 0A    A            LDAA  #$0A        SET TRCS FOR ON-CHIP I/O
00317A B8D4 97 11    A            STAA  TRCS
00318A B8D6 8D C8 B8A0            BSR   COON        TURN ON CONSOLE PRINTER
00319A B8D8 CE BFAA  A            LDX   #PRO        PR LILBUG
00320A B8DB BD BA9F  A            JSR   PDATA       WITH CR/LF
00321A B8DE 86 D0    A            LDAA  #$D0        MASK I IN CC
00322A B8E0 97 F3    A            STAA  SAVSTK+6
00323A B8E2 CE EFEA  A            LDX   #H4.91      DEFAULT CYCLE WAIT
00324A B8E5 DF DA    A            STX   WAITT       FOR 2.45 XTAL
00325                           * INIT ON-CHIP CLOCK TRACE
00326A B8E7 7C 0008  A            INC   TCSR        SET OLVL BIT HI

00329                           ************** MAIN **************
00330                           * PROMPT USER
00331                           * READ NEXT COMMAND
00332                           *
00333A B8EA 8E 00D9  A  MAIN     LDS   #STACK
00334A B8ED 7F 00FE  A            CLR   OUTSW       MAKE SURE INPUT IS ECHOED
00335A B8F0 BD BAA3  A            JSR   PCRLF       PRINT CR/LF
00336A B8F3 86 2B    A            LDAA  #'+
00337A B8F5 BD B87F  A            JSR   OUTCH
00338A B8F8 BD B999  A            JSR   INPUTA      A-F ALPHA
00339A B8FB 25 ED B8EA            BCS   MAIN        ABORT
00340A B8FD 27 0A B909            BEQ   MAIN01
00341                           * HEX VALIDITY CHK
00342A B8FF BD B98C  A            JSR   VALIN
00343A B902 25 E6 B8EA            BCS   MAIN        <ADR>/ VALID?
00344A B904 CE B9EF  A            LDX   #MEM01      ENTER MEMORY ROUTINE
00345A B907 20 6C B975            BRA   MAIN08      SET UP FOR RTN
00346                           * A CONTAINS FIRST INPUT CHARACTER
00347A B909 CE BB86  A  MAIN01 LDX  #NEXT        CHK FOR TRACE 1
00348A B90C 81 2E    A            CMPA  #'.         QUICK TRACE
00349A B90E 27 65 B975            BEQ   MAIN08
00350A B910 CE BA38  A            LDX   #MEMSL
00351A B913 81 2F    A            CMPA  #'/         QUICK MEM EXAMINE
00352A B915 27 5E B975            BEQ   MAIN08
00353                           *
00354                           * READ IN STRING. PUSH STRING UNTO THE
00355                           *   STACK. MARK TOP OF STRING IN 'STRTX'
00356                           *
00357A B917 9F E1    A            STS   STRTX       SAVE PTR TO INPUT STRING
00358A B919 7F 00E0  A            CLR   CT          INPUT CHAR CT
00359A B91C 8D 5D B97B MAIN03 BSR  TERM        CHECK FOR TERMINATORS
00360A B91E 27 13 B933            BEQ   SRCH        GOT ONE,GO DO COMPARES
00361A B920 7C 00E0  A            INC   CT          CT + 1 -> CT
00362A B923 36                    PSHA              SAVE INPUT CHAR ON STACK
00363A B924 30                    TSX               CHECK STACK POINTER
00364A B925 8C 0080  A            CPX   #LOWRAM
00365A B928 27 23 B94D            BEQ   MERROR      CHK IF END OF STK
00366A B92A BD B999  A            JSR   INPUTA      GO GET NEXT CHAR
00367A B92D 25 24 B953            BCS   MAIN07      ESCAPE
00368A B92F 26 1C B94D            BNE   MERROR      NBRS ARE NOT ALLOWED
00369A B931 20 E9 B91C            BRA   MAIN03      LOOP
00370                           *
00371                           * HERE AFTER STRING HAS INPUT. CHECK IT AGAINST
00372                           *  FUNCTION TABLE. STRTX POINTS TO THE
00373                           *   INPUT STRING.
00374                           *
00375A B933 97 E6    A  SRCH     STAA  BBLK        LOCAL VAR - SAVE DELIMITER
00376A B935 CE B800  A            LDX   #FCTABL     GET BEG OF TABLE
00377A B938 DF E3    A            STX   NEXTX       SAVE IN TEMP
00378A B93A DE E3    A  SRCH01 LDX  NEXTX       GET NEXT PTR INTO TABLE
00379A B93C 3C                    PSHX              SAVE A COPY ON STACK
00380A B93D E6 00    A            LDAB  0,X         GET ENTRY SIZE
00381A B93F 3A                    ABX               CALCULATE ADDR OF NEXT ENTRY
00382A B940 DF E3    A            STX   NEXTX       SAVE FOR NEXT SEARCH
00383A B942 C0 03    A            SUBB  #3          SUB OFF ADDR SIZE
00384A B944 D1 E0    A            CMPB  CT          IS INPUT LENGTH=ENTRY LENGTH?
00385A B946 27 0D B955            BEQ   SRCH03      YES,A POSSIBLE MATCH
00386                           * NO MATCH ON THIS ENTRY
00387                           * CHECK FOR TABLE TERMINATORS
00388                           * -2 = END OF TABLE
00389                           * IF NOT -1 OR -2, NOT RECOGNIZE END OF TABLE
00390                           * B IS ALLREADY TERM-3
```

```
00391A B948 38                      PULX              CLEAN STACK
00392A B949 C1 FB      A SRCH02 CMPB    #-5           END OF TABLE SEARCH?
00393A B94B 26 ED B93A          BNE     SRCH01        NO,KEEP TRUCKIN
00394                         * INPUT STRING NOT FOUND ! GO GRIPE
00395                         * HERE ON ERROR. PRINT ? AND
00396                         *    GO BACK TO MAIN START
00397A B94D CE BFA8    A MERROR LDX     #QMARK
00398A B950 BD BA9F    A        JSR     PDATA
00399A B953 20 95 B8EA MAIN07 BRA      MAIN
00400                         *
00401                         * INPUT LENGTH=TABLE ENTRY LENGTH. TRY
00402                         *    FOR A MATCH. B=SIZE; (SP) = TABLE PTR
00403                         *
00404A B955 DE E1      A SRCH03 LDX     STRTX         INIT PTR TO INPUT STRING
00405A B957 DF E9      A        STX     TEMPA
00406A B959 38           SRCH04 PULX                  RESTORE CURRENT TABLE PTR
00407A B95A 08                  INX
00408A B95B A6 00      A        LDAA    0,X           GET TABLE CHAR
00409A B95D 3C                  PSHX                  SAVE FOR NEXT LOOP
00410A B95E DE E9      A        LDX     TEMPA         GET INPUT PTR
00411A B960 A1 00      A        CMPA    0,X           INPUT CHAR=TABLE CHAR?
00412A B962 27 03 B967          BEQ     SRCH05        YES
00413A B964 38                  PULX                  NO,CLEAN STAACK
00414A B965 20 D3 B93A          BRA     SRCH01        GET NEXT TABLE VALUE
00415                         * HERE WHEN A CHARACTER MATCHED
00416A B967 09           SRCH05 DEX                   DEC INPUT PTR FOR NEXT TIME
00417A B968 DF E9      A        STX     TEMPA
00418A B96A 5A                  DECB                  COMPARED ALL CHARS?
00419A B96B 26 EC B959          BNE     SRCH04
00420                         *
00421                         * WE HAVE A MATCH! GO TO THE ROUTINE
00422                         *
00423A B96D 38                  PULX                  GET TABLE PTR
00424A B96E 08                  INX                   POINT TO ADDRESS IN TABLE
00425A B96F 9E E1      A        LDS     STRTX         CLEAN STACK
00426A B971 EE 00      A        LDX     0,X           GET ROUTINE ADDRESS
00427A B973 96 E6      A        LDAA    BBLK          LOAD TERMINATOR
00428A B975 AD 00      A MAIN08 JSR     0,X           GO TO ROUTINE
00429A B977 25 D4 B94D          BCS     MERROR        ERROR RETURN
00430A B979 20 D8 B953          BRA     MAIN07        GO BACK TO MAIN
00431                         ********** TERMINATOR SUB
00432                         *
00433                         * CHECK INPUT CHAR FOR A TERMINATOR
00434                         *   TERMINATORS ARE: , BLANK <CR>
00435                         *   CHAR IN A ON CALL
00436                         *   Z BIT SET ON EXIT IFF CHAR WAS
00437                         *   TERMINATOR
00438                         ***********
00439A B97B 81 2C      A TERM   CMPA    #',           COMMA?
00440A B97D 27 0A B989          BEQ     TERM02
00441A B97F 81 20      A        CMPA    #'            BLANK?
00442A B981 27 06 B989          BEQ     TERM02
00443A B983 81 0D      A        CMPA    #$0D          CR?
00444A B985 27 02 B989          BEQ     TERM02
00445A B987 81 2D      A        CMPA    #'-           ALLOW MINUS
00446A B989 39           TERM02 RTS                   RETURN WITH Z BIT
00447                         *

00449                         ************** VALIN ***************
00450                         * VALIDATE INPUT - ENTRY VALINP READS INPUT
00451                         * ALLOW 4 DIGIT INPUT W/LEADING 0'S NOT COUNT
00452                         * SET CC NEG IF ERROR
00453A B98A 8D 11 B99D VALINP BSR     INPUT           READ HEX
00454A B98C 23 0A B998 VALIN  BLS     VALRTN
00455A B98E C1 04      A        CMPB    #4
00456A B990 2F 39 B9CB          BLE     INPUTC
00457A B992 7D 00EC    A        TST     OVFL          LEADING ZEROES?
00458A B995 27 34 B9CB          BEQ     INPUTC
00459A B997 0D                  SEC                   SET C FOR ERROR RETURN
00460A B998 39           VALRTN RTS

00462                         *****INPUT - READ ROUTINE
00463                         * INPUT ENTRY. SET B=0, READ A-F AS HEX
00464                         * INPUTA ENTRY SET B#0, READ A-F AS ALPHA
00465                         * X= HEX NUMBER (ALSO IN TEMPA)
00466                         * A=LAST CHAR READ (NON-HEX)
00467                         * B= # HEX CHAR READ (TEMP)
00468                         * OVFL # 0 IF OVERFLOW FROM LEFT SHIFT
```

```
00469                          * CC SET FROM LDAB BEFORE RETRN
00470                          * C SET IF ABORT
00471A B999 C6 F0   A INPUTA LDAB  *$F0      READ A-F AS ALPHA
00472A B99B 20 01 B99E        BRA   INPUT2
00473A B99D 5F        INPUT   CLRB            READ A-F AS HEX
00474A B99E CE 0000 A INPUT2 LDX   *0        INIT VAR TO 0
00475A B9A1 DF E9   A         STX   TEMPA
00476A B9A3 DF EB   A         STX   TEMP      0 TTEMP, OVFL
00477A B9A5 CE 00E9 A         LDX   *TEMPA    X PNT TO WH INPUT CHR STORED
00478A B9A8 8D 25 B9CF INPUT3 BSR  INHEX     READ A CHAR
00479A B9AA 25 17 B9C3        BCS   INPUT7    JMP IF NOT HEX
00480A B9AC C6 04   A         LDAB  *4
00481A B9AE 68 01   A INPUT5 ASL   1,X
00482A B9B0 69 00   A         ROL   0,X
00483A B9B2 24 03 B9B7        BCC   INPUT6    SET FLAG IF OVERFLOW
00484A B9B4 7C 00EC A         INC   OVFL
00485A B9B7 5A       INPUT6  DECB            LEFT SHIFT 4 BITS
00486A B9B8 26 F4 B9AE        BNE   INPUT5
00487A B9BA AA 01   A         ORAA  1,X      ADD IN LSB
00488A B9BC A7 01   A         STAA  1,X
00489A B9BE 7C 00EB A         INC   TEMP
00490A B9C1 20 E5 B9A8        BRA   INPUT3
00491A B9C3 81 18   A INPUT7 CMPA  *CNTLX    CHK IF ABORT
00492A B9C5 26 02 B9C9        BNE   INPUT9    SKIP IF NOT ABORT
00493              B9C7 A NOTHEX EQU   *        ERROR ENTRY FROM INHEX
00494A B9C7 0D                SEC             SET C FOR ERROR INDICATOR
00495A B9C8 39                RTS
00496A B9C9 DE E9   A INPUT9 LDX   TEMPA     SET REG X=0 READ
00497A B9CB D6 EB   A INPUTC LDAB  TEMP      SET REG B=0 HEX CHAR READ
00498A B9CD 0C                CLC             GOOD RETURN
00499A B9CE 39                RTS

00501                     ************ INHEX ****************
00502                     * INPUT 1 HEX CHAR, CONVERT TO HEX
00503                     * RETURN HEX IN REG A
00504                     * REG B = 0 CONVERT A-F TO HEX
00505                     * REG B < 0 LEAVE A-F ALPHA
00506A B9CF BD B853 A INHEX  JSR   INCHNP    (INHEX) MUST BE NEG
00507A B9D2 81 30   A         CMPA  *'0
00508A B9D4 2B F1 B9C7        BMI   NOTHEX    NOT HEX
00509A B9D6 81 39   A         CMPA  *'9
00510A B9D8 2F 0D B9E7        BLE   IN1HG     GOOD
00511A B9DA 5D                TSTB            A-F NUMBERS?
00512A B9DB 2B EA B9C7        BMI   NOTHEX    NO
00513A B9DD 81 41   A         CMPA  *'A
00514A B9DF 2B E6 B9C7        BMI   NOTHEX    NOT HEX
00515A B9E1 81 46   A         CMPA  *'F
00516A B9E3 2E E2 B9C7        BGT   NOTHEX    NOT HEX
00517A B9E5 80 07   A         SUBA  *7
00518A B9E7 84 0F   A IN1HG  ANDA  *$F
00519A B9E9 5F                CLRB            AFTER FIND 0-9 CLEARR
00520                     * CLRB ALSO CLEARS C BIT FOR GOOD RETURN
00521A B9EA 39                RTS             GOOD HEX - RTN

00523                  *********** MEMORY EXAMINE/CHANGE ****************
00524                     * PRINT VALUE AT <ADR>, MAINTAIN PNTR
00525                     * M <ADR><SPACE>
00526                     * <ADR>/
00527                     * <ADR> IS 1-4 HEX, NOT COUNTING LEADING ZEROES
00528                     * SUBCOMMANDS
00529                     *      <DATA> MODIFY VALUE AT CURRENT LOC
00530                     *      SP     INCR POINTER, PR VALUE AT NEXT ADR
00531                     *      ,      INCR PNTR, NO PRINT
00532                     *      LF     INCR PNTR, PR ADR & VALUE ON NEXT LINE
00533                     *      UA     DECR PNTR, PR ADR & VALUE ON NEXT LINE
00534                     *      /      PR CURRENT ADR AND VALUE
00535                     *      CR     TERMINATE MEM/EXAM COMMAND
00536A B9EB 8D 9D B98A MEMORY BSR  VALINP
00537A B9ED 2F 52 BA41        BLE   MERRTN    NOT HEX - ERROR
00538A B9EF DE E9   A MEM01  LDX   TEMPA     RRESET FOR ADR/
00539A B9F1 81 2F   A         CMPA  *'/       / DELIMITER?
00540A B9F3 27 04 B9F9        BEQ   MEM02
00541A B9F5 81 20   A         CMPA  *$20     SPACE?
00542A B9F7 26 48 BA41        BNE   MERRTN
00543A B9F9 8D 77 BA72 MEM02 BSR   OUT2H     PRINT VALUE
00544A B9FB DF E7   A MEM25  STX   PNTR
00545A B9FD 3C                PSHX
```

```
00546A B9FE 5F              CLRB                A-F NUMBER FLAG
00547A B9FF 8D 9C B99D      BSR    INPUT        X=ADR
00548A BA01 38              PULX
00549A BA02 25 3E BA42      BCS    RETRN        IF NEG - ABORT
00550A BA04 27 07 BA0D      BEQ    MEM03        JUMP IF NOT HEX
00551A BA06 D6 EA    A      LDAB   TEMPA+1      GET LAST BYTE
00552A BA08 BD BA88  A      JSR    STRCHK       STORE B AND CHK FOR CHG MEM
00553A BA0B 25 35 BA42      BCS    RETRN        ERR IN CHG MEMORY
00554A BA0D 81 0D    A MEM03 CMPA  #$0D         CR?
00555A BA0F 27 31 BA42      BEQ    RETRN        END MEM/EX?
00556                       *** X = ADR OF CURRENT BYTE
00557A BA11 81 2C    A      CMPA   #',          COMMA?
00558A BA13 26 03 BA18      BNE    MEM33
00559A BA15 08              INX                 OPEN NEXT LOC, DO NOT PR
00560A BA16 20 E3 B9FB      BRA    MEM25
00561A BA18 81 20    A MEM33 CMPA  #$20         SPACE?
00562A BA1A 26 03 BA1F      BNE    MEM04
00563A BA1C 08              INX                 INCR PNTR
00564A BA1D 20 DA B9F9      BRA    MEM02        GO PR VALUE
00565A BA1F 81 0A    A MEM04 CMPA  #$A          LF?
00566A BA21 26 06 BA29      BNE    MEM06
00567A BA23 08              INX
00568A BA24 BD BAA7  A      JSR    PCR          OUT CR, NO LF
00569A BA27 20 0D BA36      BRA    MEM12        PR ADDR,SPACE
00570A BA29 81 5E    A MEM06 CMPA  #$5E         UA?
00571A BA2B 26 03 BA30      BNE    MEM08
00572A BA2D 09              DEX
00573A BA2E 20 04 BA34      BRA    MEM10
00574A BA30 81 2F    A MEM08 CMPA  #'/          SLASH?
00575A BA32 26 0D BA41      BNE    MERRTN
00576A BA34 8D 6D BAA3 MEM10 BSR   PCRLF        PR CR/LF
00577A BA36 DF E7    A MEM12 STX   PNTR         SAVE NEW PNTR ADR
00578        BA38    A MEMSL EQU   *            FOUND / AS INSTR
00579A BA38 CE 00E7  A      LDX    #PNTR        X PNT TO PR OBJECT
00580A BA3B 8D 2C BA69      BSR    OUT4HS       ADR,SP
00581A BA3D DE E7    A      LDX    PNTR         RESET X TO PNTR
00582A BA3F 20 B8 B9F9      BRA    MEM02
00583                       *
00584A BA41 0D       MERRTN SEC                 SET C FOR ERR RETURN
00585A BA42 39       RETRN  RTS

00587                       ********** OFFSET **********
00588                       *O <ADR> CALCULATES OFFSET FROM LAST MEMORY REF
00589                       *WHICH SHOULD BE LOC OF REL ADR OF BR INSTR, TO
00590                       *THE <ADR> SPECIFIED
00591                       * IF A=0, B<80 DISTANCE CHK
00592                       * IF A=FF, B>7F
00593                       *
00594A BA43 BD BD1D  A OFFSET JSR  RD2ADR       READ 2 ADDR
00595A BA46 25 F9 BA41      BCS    MERRTN       ERR CHK
00596A BA48 DC E9    A      LDD    TEMPA
00597A BA4A 83 0001  A      SUBD   #1
00598A BA4D 93 E7    A      SUBD   PNTR         OFFSET=TO-(FROM+1)
00599A BA4F C1 7F    A      CMPB   #$7F         CHK IF VALID DISTANCE
00600A BA51 22 05 BA58      BHI    OFF4
00601A BA53 4D              TSTA                POSITIVE DISTANCE?
00602A BA54 27 06 BA5C      BEQ    OFF6
00603A BA56 20 E9 BA41      BRA    MERRTN
00604A BA58 81 FF    A OFF4 CMPA   #$FF         NEG DISTANCE
00605A BA5A 26 E5 BA41      BNE    MERRTN
00606A BA5C D7 EB    A OFF6 STAB   TEMP         PR OFFSET
00607A BA5E 8D 43 BAA3      BSR    PCRLF        PR LF AFTER USER CR
00608A BA60 CE 00EB  A      LDX    #TEMP
00609A BA63 8D 07 BA6C      BSR    OUT2HS
00610A BA65 8D 3C BAA3      BSR    PCRLF
00611A BA67 20 CF BA38      BRA    MEMSL        GO TO / ROUTINE

00613                       *************** OUT4HS ***************
00614                       * PRINT 2 BYTES AND SPACE
00615                       * REG X - ADR OF 1ST BYTE
00616                       * X WILL BE INCREMENTED BY 1
00617A BA69 8D 07 BA72 OUT4HS BSR  OUT2H
00618A BA6B 08              INX                 GET NEXT BYTE
00619                       * FALL THRU OUT2HS
```

```
00621                      ************ OUT2HS ****************
00622                      * PRINT 1 BYTE AND SPACE
00623                      * REG X - ADR OF BYTE
00624A BA6C 8D 04 BA72 OUT2HS BSR    OUT2H       1 BYTE
00625A BA6E 86 20      A SPACE  LDAA  #$20        PR SPACE
00626A BA70 20 3A BAAC        BRA    XOUTCH      PR 1 CHAR & RTN

00628                      ************ OUT2H *****************
00629                      * PRINT 1 BYTE
00630                      * REG X - ADR OF BYTE
00631A BA72 A6 00      A OUT2H  LDAA  0,X
00632A BA74 36                 PSHA               READ BYTE ONLY ONCE
00633A BA75 8D 03 BA7A         BSR    OUTHL
00634A BA77 32                 PULA
00635A BA78 20 04 BA7E         BRA    OUTHR       RIGHT

00637                      ************ OUTHL *****************
00638                      * CONVERT LEFT 4 BITS OF BYTE TO DISPLAY
00639A BA7A 44         OUTHL  LSRA                OUTPUT LEFT 4 BINARY BITTS
00640A BA7B 44                LSRA
00641A BA7C 44                LSRA
00642A BA7D 44                LSRA

00644                      ************ OUTHR *****************
00645                      * CONVERT RIGHT 4 BITS OF BYTE AND PRINT
00646A BA7E 84 0F      A OUTHR  ANDA  #$F         OUTPUT RIGHT 4 BITS
00647A BA80 8B 90      A        ADDA  #$90        CONVERT TO DISPLAY
00648A BA82 19                 DAA
00649A BA83 89 40      A        ADCA  #$40
00650A BA85 19                 DAA
00651A BA86 20 24 BAAC         BRA    XOUTCH      PR 1 CHAR & RTN

00653                      ************ STRCHK ****************
00654                      * STORE B AT 0,X & VERIFY STORE *****
00655                      * DETECTS NON-EXISTENT MEMORY, ROM, PROTECTED RAM
00656A BA88 E7 00      A STRCHK STAB  0,X         STORE B
00657A BA8A E1 00      A        CMPB  0,X         VERIFY MEMORY CHG
00658A BA8C 27 B4 BA42         BEQ    RETRN       OK
00659A BA8E CE BFB5    A        LDX    #NOCHG     MSG
00660A BA91 8D 0C BA9F         BSR    PDATA
00661A BA93 20 AC BA41         BRA    MERRTN      SET C FOR ERR RETURN
00662                      *
00663                      ************ PDATA1 ****************
00664                      * PRINT DATA STRING
00665                      * REG X POINTS TO PRINT ARRAY
00666                      * X WILL BE INCREMENTED
00667A BA95 8D 15 BAAC PDATA2 BSR    XOUTCH      CALL OUTPUT ROUTINE
00668A BA97 08                INX                X=ADR OF OUTPUT ARRAY
00669A BA98 A6 00      A PDATA1 LDAA  0,X        GET CHAR
00670A BA9A 81 04      A        CMPA  #4         EOT?
00671A BA9C 26 F7 BA95         BNE    PDATA2
00672A BA9E 39                 RTS

00674                      ************ PDATA *****************
00675                      * CR/LF THEN PRINT DATA STRING
00676A BA9F 8D 02 BAA3 PDATA  BSR    PCRLF       CR/LF, DATA STRING
00677A BAA1 20 F5 BA98        BRA    PDATA1

00679                      ************ PCRLF *****************
00680                      * OUTPUT CR/LF
00681                      * SAVE, RESTORE REG X
00682A BAA3 86 0A      A PCRLF  LDAA  #$A        OUTPUT LF
00683A BAA5 8D 05 BAAC         BSR    XOUTCH      PR & RTN

00685A BAA7 86 0D      A PCR    LDAA  #$D        DO CR
00686A BAA9 8D 01 BAAC         BSR    XOUTCH      PR & RTN
00687A BAAB 4F                 CLRA
00688A BAAC 7E B87F    A XOUTCH JMP    OUTCH       OUTPUT & RTN

00690                      ********** PRINT REGISTERS **********
00691                      * PR REGISTERS ACROSS PAGE
00692                      * PR 2ND LINE REG, READING INPUT
00693                      *     SPACE - PR CONTENTS REG, GO TO NEXT REG
00694                      *     HEX,SP - MODIFY REG, GO TO NEXT REG
00695                      *     HEX,CR - MODIFY REG, RTN
```

```
00696                        *      CR OR OTHER COMBINATION - NO CHG, RTN
00697A BAAF 8D 66 BB17 REGSTR BSR    PREGS1
00698A BAB1 8D F0 BAA3        BSR    PCRLF      CR/LF AFTER REG PRINT
00699A BAB3 CE 00ED  A REGS1  LDX    #SAVSTK    PSEUDO REGS
00700A BAB6 5F                CLRB              INIT OFFSET
00701A BAB7 3C         REGS2  PSHX              SAVE REG PNTR
00702A BAB8 CE BFCF  A        LDX    #ARRAY     CONTAINS REG NAMES
00703A BABB 3A                ABX               ADD OFFSET
00704A BABC A6 00    A        LDAA   0,X        GET CURRENT REG
00705A BABE 8D 62 BB22        BSR    OUTDA      PR REG NAME, DASH
00706A BAC0 A6 01    A        LDAA   1,X        #BYTES FLAG
00707A BAC2 38                PULX              REG PNTR
00708A BAC3 7D 00E0  A        TST    CT         PRINT OR MOD?
00709A BAC6 27 0B BAD3        BEQ    REGS3      MODIFY
00710A BAC8 4D                TSTA              CHK # BYTES
00711A BAC9 27 03 BACE        BEQ    REGS4
00712A BACB 8D A5 BA72        BSR    OUT2H      PR 2 HEX DIGITS
00713A BACD 08                INX
00714A BACE 8D 9C BA6C REGS4  BSR    OUT2HS     PR 2 HEX + SP_
00715A BAD0 08                INX
00716A BAD1 20 04 BAD7        BRA    REGS6
00717A BAD3 37         REGS3  PSHB              SAVE OFFSET
00718A BAD4 8D 08 BADE        BSR    INDAT      GO READ INPUT
00719A BAD6 33                PULB              RETRIEVE OFFSET
00720A BAD7 CB 02    A REGS6  ADDB   #2         UPDATE
00721A BAD9 C1 0C    A        CMPB   #12        ALL REG CHKED
00722A BADB 26 DA BAB7        BNE    REGS2      NO - LOOP
00723A BADD 39                RTS

00725                        ************** INDAT **************
00726                        * INPUT FOR REG MODIFICATION
00727A BADE 36         INDAT  PSHA              SAVE LEN FLG
00728A BADF 3C                PSHX              REG PNTR ADR
00729A BAE0 BD B99D  A        JSR    INPUT
00730A BAE3 38                PULX              RESTORE
00731A BAE4 33                PULB
00732A BAE5 25 1B BB02        BCS    PRERR      ABORT
00733A BAE7 27 1D BB06        BEQ    INDAT2     NOT HEX
00734A BAE9 BD B97B  A        JSR    TERM       ACCEPT SP , CR
00735A BAEC 26 14 BB02        BNE    PRERR      RTN TO MAIN
00736A BAEE 5D                TSTB              CHK LENGTH FLAG
00737A BAEF 27 09 BAFA        BEQ    INDAT0
00738A BAF1 36                PSHA              SAVE LAST CHAR READ
00739A BAF2 DC E9    A        LDD    TEMPA      GET 2 BYTE READ IN
00740A BAF4 ED 00    A        STD    0,X
00741A BAF6 32                PULA              RESTORE LAST CHAR
00742A BAF7 08                INX               INCR REG PNTR
00743A BAF8 20 04 BAFE        BRA    INDAT5
00744A BAFA D6 EA    A INDAT0 LDAB   TEMPA+1    1 BYTE CHANGE
00745A BAFC E7 00    A        STAB   0,X
00746A BAFE 81 0D    A INDAT5 CMPA   #$0D       CR - RTN
00747A BB00 26 13 BB15        BNE    INDAT1
00748A BB02 38         PRERR  PULX              POP RTN ADR
00749A BB03 33                PULB              REMOVE FLAG FROM STK
00750A BB04 4F                CLRA              NO BELL ON RETURN
00751A BB05 39                RTS               RTN TO MAIN
00752A BB06 81 20    A INDAT2 CMPA   #$20       NO HEX, SPACE
00753A BB08 26 F8 BB02        BNE    PRERR      RTN TO MAIN
00754A BB0A 5D                TSTB              2 OR 4 CHAR
00755A BB0B 26 05 BB12        BNE    INDAT4
00756A BB0D BD BA6C  A        JSR    OUT2HS     PR 2 CHAR,SPACE
00757A BB10 20 03 BB15        BRA    INDAT1
00758A BB12 BD BA69  A INDAT4 JSR    OUT4HS     PR 4 CHAR, SPACE
00759A BB15 08         INDAT1 INX               ADJUST REG PNTR
00760A BB16 39                RTS

00762                        ************** PREGS **************
00763                        * PRINT REGS - P,X,A,B,C,S
00764A BB17 8D 8A BAA3 PREGS1 BSR    PCRLF
00765A BB19 7C 00E0  A PREGS  INC    CT         SET FLAG-PRT REG
00766A BB1C 8D 95 BAB3        BSR    REGS1      GO PRINT
00767A BB1E 7F 00E0  A        CLR    CT         RESET FLAG
00768A BB21 39                RTS

00770                        ************** OUTDA **************
00771                        * PRINT REG A, -
00772A BB22 8D 02 BB26 OUTDA  BSR    ZOUTCH     OUTPUT REG A
00773A BB24 86 2D    A        LDAA   #'-        DASH
```

```
00774A BB26 7E B87F   A ZOUTCH JMP     OUTCH
00775                       ********* BRKPNT *********
00776                       * COME HERE AFTER RECOGNIZE B(DELIM)
00777                       * B      DISPLAY BRKPNT
00778                       * B -    REMOVE BRKPNT
00779                       * B (ADR) INSERT BRKPNT
00780A BB29 81 0D     A BRKPNT CMPA   #$D          CR?
00781A BB2B 27 0F BB3C       BEQ     PRBRK        PRINT
00782A BB2D 81 2D     A      CMPA    #'-          DELETE?
00783A BB2F 27 16 BB47       BEQ     DELBRK
00784A BB31 BD B98A   A      JSR     VALINP
00785A BB34 23 0F BB45       BLS     GOX2         ABORT?
00786A BB36 81 0D     A BP02 CMPA    #$D          CR
00787A BB38 26 0B BB45       BNE     BERRTN       ERROR RTN
00788A BB3A DF F6     A      STX     BKADR        STORE IN TABLE
00789                       * FALL THRU AND PR BRKPNTS
00790                       * PRINT BREAKPOINT
00791A BB3C BD BAA3   A PRBRK JSR    PCRLF
00792A BB3F CE 00F6   A      LDX     *BKADR
00793A BB42 7E BA69   A      JMP     OUT4HS       PRINT & RETURN

00795        BB45    A GOX2  EQU     *            ERROR RETURN ENTRY FROM G
00796A BB45 0D              BERRTN SEC
00797A BB46 39              BRTN    RTS

00799                       * DELETE BRKPNT
00800A BB47 BD B853   A DELBRK JSR   INCHNP
00801A BB4A 81 0D     A      CMPA    #$D          CR?
00802A BB4C 26 F7 BB45       BNE     BERRTN
00803A BB4E 4F              CLRA
00804A BB4F 5F              CLRB
00805A BB50 DD F6     A      STD     BKADR        ZERO BRKPNT ADR
00806A BB52 20 E8 BB3C       BRA     PRBRK        GO PRINT TABLE

00808                       ********* CALL *********
00809                       * CALL USER ROUTINE AS SUBR
00810                       * USER RTS RETURNS TO MONITOR
00811                       * STK PNTR NOT GOOD ON RETURN
00812                       * C (ADR) (CR) OR C (CR)
00813A BB54 97 FF     A CALL STAA    CALLF        SET FLAG # 0

00815                       ********* G *********
00816                       * GO EXECUTE USER CODE
00817                       * G(CR) OR G (ADR)
00818A BB56 81 0D     A GOXQT CMPA   #$D          CR
00819A BB58 27 0E BB68       BEQ     GOX6         XQT FROM CURRENT PC
00820A BB5A BD B98A   A      JSR     VALINP
00821A BB5D 23 E6 BB45       BLS     GOX2
00822A BB5F 81 0D     A      CMPA    #$D          CR?
00823A BB61 26 E2 BB45       BNE     GOX2         ERR
00824A BB63 7F 00FC   A      CLR     EXONE
00825A BB66 DF ED     A      STX     SAVSTK       SET USER PC
00826A BB68 BD BAA3   A GOX6 JSR     PCRLF
00827A BB6B 96 FF     A      LDAA    CALLF        CALL CMD?
00828A BB6D 27 0E BB7D       BEQ     GOX7         NO
00829A BB6F 7F 00FF   A      CLR     CALLF
00830A BB72 DE F4     A      LDX     SPSAVE       GET USER STK
00831A BB74 CC BB9D   A      LDD     #CRTS        RTN TO MONITOR ADR
00832A BB77 09              DEX
00833A BB78 ED 00     A      STD     0,X          STOR ON USER STK
00834A BB7A 09              DEX                  ADJUST USER STK
00835A BB7B DF F4     A      STX     SPSAVE       RESAVE STK
00836                       * NOW GO XQT USER SUBR
00837A BB7D 96 FC     A GOX7 LDAA    EXONE        STOPPED ON BRKPNT
00838A BB7F 26 03 BB84       BNE     GOX8
00839A BB81 BD BC44   A      JSR     SETB
00840A BB84 20 15 BB9B GOX8  BRA     BARMS

00842                       ********* . (PERIOD) *********
00843                       * TRACE 1 INSTRUCTION
00844A BB86 CE 0001   A NEXT LDX     #1
00845A BB89 20 09 BB94       BRA     TRACE2

00847                       ********* TRACE *********
00848                       * T (HEX) - TRACE (HEX) INSTRUCTIONS
00849A BB8B 81 0D     A TRACE CMPA   #$D          T(CR)? TRACE 1 INSTR
00850A BB8D 27 F7 BB86       BEQ     NEXT
```

```
00851A BB8F BD B99D  A           JSR   INPUT    GET <HEX>
00852A BB92 2F 81 BB45           BLE   GOX2     RTN IF ABORT
00853A BB94 DF FA    A   TRACE2  STX   NTRACE   STORE <HEX>
00854A BB96 27 AD BB45           BEQ   GOX2     RTN IF TRACE = 0
00855A BB98 7C 00FC  A           INC   EXONE    XQT 1 INSTR
00856A BB9B 20 5E BBFB  BARMS    BRA   ARMSTK

00858                    ********** CALL SUBR **********
00859                    * ENTRY AFTER C COMMAND, AFTER XQT USER RTS
00860                    * SAVE USER REGISTERS
00861                    * PRINT REGISTERS
00862                    * RETURN TO ROUTINE CALLING C COMMAND ROUTINE
00863A BB9D 36           CRTS    PSHA           SAVE TO GET CC
00864A BB9E 07                   TPA
00865A BB9F 97 F3    A           STAA  SAVSTK+6 CC
00866A BBA1 32                   PULA
00867A BBA2 9F F4    A           STS   SPSAVE   STK PNTR
00868A BBA4 8E 00D9  A           LDS   #STACK
00869A BBA7 DD F1    A           STD   SAVSTK+4 A,B
00870A BBA9 DF EF    A           STX   SAVSTK+2 X
00871A BBAB CE BB9D  A           LDX   #CRTS    PC PNT TO MONITOR
00872A BBAE DF ED    A           STX   SAVSTK
00873A BBB0 7E BC6B  A           JMP   ENDCAL   GO PR REGS, 0 EXONE

00875                    * SETCLK - USED BY ON-CHIP CLOCK
00876                    * SET TIMER TO COMPARE AFTER 1 CYCLE
00877A BBB3 C6 18    A   SETCLK  LDAB  #$18     SET # CYCLES
00878A BBB5 DE 09    A           LDX   CLOCK    GET TIME
00879A BBB7 3A                   ABX            ADD # CYCLES
00880A BBB8 DF 0B    A           STX   OCREG    STORE IN COMPARE REG
00881A BBBA 39                   RTS

00883                    ********** NMI **********
00884                    * ENTER FROM XQT 1 INSTR-TRACE OR XQT OVER BRKPNT
00885                    * MOVE REGS FROM USER STK TO MONITOR STORAGE
00886                    * REPLACE BRKPNT WITH USER CODE
00887                    * IF NOT TRACING, REPLACE USER CODE W/BRKPNT (3F)
00888                    * IF TRACING, PRINT REGISTERS
00889                    * EXECUTE NEXT USER INSTRUCTION
00890A BBBB 7C 0008  A   NMI     INC   TCSR     SET LEVEL HI
00891A BBBE 8D F3 BBB3           BSR   SETCLK   NO NMI, BUT CHANGE LEVEL
00892A BBC0 30                   TSX
00893A BBC1 8E 00D9  A           LDS   #STACK
00894A BBC4 8D 56 BC1C           BSR   MOVSTK   SAVE USER REGS
00895A BBC6 BD BC34  A           JSR   RBRK     REMOVE BRKPNT
00896A BBC9 DE FA    A           LDX   NTRACE   TRACE?
00897A BBCB 26 09 BBD6           BNE   NMI01
00898A BBCD 7F 00FC  A           CLR   EXONE
00899A BBD0 8D 72 BC44           BSR   SETB     SET BRKPNT
00900A BBD2 25 1D BBF1            BCS   NMI03
00901A BBD4 20 25 BBFB           BRA   ARMSTK   GO SET UP TO XQT

00903A BBD6 09           NMI01   DEX
00904A BBD7 DF FA    A   NMI015  STX   NTRACE   DEC TRACE COUNT
00905A BBD9 26 03 BBDE           BNE   NMI02
00906A BBDB 7F 00FC  A           CLR   EXONE
00907                    * PRINT TRACE LINE
00908                    * OP-XX P-XXXX X-XXXX A-XX B-XX C-XX S-XXXX
00909                    * CHECK IF USER TYPED CONTROL X TO TERMINATE TRACE
00910A BBDE CE 0000  A   NMI02   LDX   #0       CLR TRACE & EXONE IF TERMINATE
00911A BBE1 BD BD08  A           JSR   CHKABT
00912A BBE4 27 F1 BBD7           BEQ   NMI015   TERMINT IF CNTL X
00913A BBE6 CE BFCB  A           LDX   #PRTOP   GET ADR OF OP-
00914A BBE9 BD BA9F  A           JSR   PDATA
00915A BBEC DE E9    A           LDX   TEMPA    GET OLD PC
00916A BBEE BD BA6C  A           JSR   OUT2HS   PR OPCODE
00917A BBF1 BD BB19  A   NMI03   JSR   PREGS    PR TRACE LINE
00918A BBF4 96 FC    A           LDAA  EXONE
00919A BBF6 26 03 BBFB           BNE   ARMSTK
00920A BBF8 7E B8EA  A           JMP   MAIN

00922                    * STACK USER REGISTERS
00923                    * MOVE FROM MONITOR STORAGE TO USER STACK
00924                    * IF TRACE - SET HARDWARE
00925A BBFB 9E F4    A   ARMSTK  LDS   SPSAVE   SET STK FOR RTI
00926A BBFD DE ED    A           LDX   SAVSTK   PC
00927A BBFF 3C                   PSHX
00928A BC00 DE EF    A           LDX   SAVSTK+2 X
```

```
00929A BC02 3C                        PSHX
00930A BC03 DC F1    A                LDD      SAVSTK+4     GET A, B
00931A BC05 36                        PSHA                  MOVE TO STK
00932A BC06 37                        PSHB
00933A BC07 96 F3    A                LDAA     SAVSTK+6     GET CC
00934A BC09 36                        PSHA
00935A BC0A 96 FC    A                LDAA     EXONE
00936A BC0C 27 0D BC1B                BEQ      ARMS04
00937A BC0E DE ED    A                LDX      SAVSTK       SAVE PC PNTR FOR NXT TRACE PRT
00938A BC10 DF E9    A                STX      TEMPA
00939                                 * ON-CHIP TRACE
00940A BC12 86 02    A                LDAA     #2           SET DDR FOR OUTPUT
00941A BC14 97 01    A                STAA     P2DDR        PORT 2
00942A BC16 7A 0008  A                DEC      TCSR         CLR OLVL BIT
00943A BC19 8D 98 BBB3                BSR      SETCLK       SET COMPARE REG,WAIT
00944            BC1B A  ARMS04       EQU      *
00945A BC1B 3B                        DUMMY    RTI

00947                                 ************* MOVSTK ***************
00948                                 * MOVE USER REGS FROM USER STACK TO MONITOR STORAGE
00949                                 * RESET USER STACK POINTER
00950A BC1C A6 00    A  MOVSTK        LDAA     0,X          MOVE C,B,A,X,PC
00951A BC1E 97 F3    A                STAA     SAVSTK+6     TO PC,X,A,B,C
00952A BC20 EC 01    A                LDD      1,X
00953A BC22 97 F2    A                STAA     SAVSTK+5
00954A BC24 D7 F1    A                STAB     SAVSTK+4
00955A BC26 EC 03    A                LDD      3,X
00956A BC28 DD EF    A                STD      SAVSTK+2
00957A BC2A EC 05    A                LDD      5,X
00958A BC2C DD ED    A                STD      SAVSTK
00959A BC2E C6 06    A                LDAB     #6
00960A BC30 3A                        ABX
00961A BC31 DF F4    A                STX      SPSAVE
00962A BC33 39                        RTS

00964                                 ************* RBRK ***************
00965                                 * REPLACE BRKPNTS (SWI) WITH USER CODE
00966                                 * BKADR - TABLE OF 4 BRKPNT ADR
00967                                 * OPCODE - TABLE OF OPCODES, CORRESPOND TO ADR
00968A BC34 96 F9    A  RBRK          LDAA     BRKFLG       IGNORE IF BRKPNTS NOT IN
00969A BC36 27 0B BC43                BEQ      RBRK6
00970A BC38 96 F8    A                LDAA     OPCODE       GET USER OPCODE
00971A BC3A DE F6    A                LDX      BKADR        GET USER BRKPNT ADR
00972A BC3C 27 02 BC40                BEQ      RBRK3        NO ADR
00973A BC3E A7 00    A                STAA     0,X          RESTORE OPCODE
00974A BC40 7F 00F9  A  RBRK3         CLR      BRKFLG       CLR BRKPNT FLAG
00975A BC43 39          RBRK6         RTS

00977                                 ************* SETB ***************
00978                                 * REPLACE USER CODE WITH 3F AT BRKPNT ADDRESS
00979                                 * IGNORE IF BREAKPOINTS ALREADY IN
00980A BC44 96 F9    A  SETB          LDAA     BRKFLG       ALREADY IN?
00981A BC46 26 5C BCA4                BNE      SHERR        SET C BIT
00982A BC48 DE F6    A                LDX      BKADR
00983A BC4A 27 0D BC59                BEQ      SETB6        SKIP IN NO ADDRESS
00984A BC4C A6 00    A                LDAA     0,X          GET OPCODE
00985A BC4E C6 3F    A                LDAB     #$3F         SET SWI
00986A BC50 BD BA88  A                JSR      STRCHK       STORE & CHK CHG
00987A BC53 25 04 BC59                BCS      SETB6        3F STORED GOOD?
00988A BC55 97 F8    A                STAA     OPCODE       SAVE OPCODE
00989A BC57 97 F9    A                STAA     BRKFLG       SET BRKPNT FLAG
00990A BC59 39          SETB6         RTS

00993                                 ********* SWI ENTRY *********
00994                                 * ENTER WITH BRKPOINT SETTING
00995                                 * SAVE USER REGISTERS
00996                                 * DECR PC TO POINT AT SWI
00997                                 * REPLACE SWI'S WITH USER CODE
00998                                 * PRINT REGISTERS
00999                                 * GO TO MAIN CONTROL LOOP
01000A BC5A 30          M.SWI         TSX                   GET USER STK
01001A BC5B 8E 00D9  A                LDS      #STACK       SET TO INTERNAL STK
01002A BC5E 8D BC BC1C                BSR      MOVSTK       SAVE USER REGS
01003A BC60 DE ED    A                LDX      SAVSTK       DECR USER PC
01004A BC62 09                        DEX
01005A BC63 DF ED    A                STX      SAVSTK
```

```
01006A BC65 DF E9    A            STX    TEMPA      SAVE FOR BRKPNT CHK
01007A BC67 96 F9    A            LDAA   BRKFLG     ERR IF NOT BRKPOINT
01008A BC69 27 09 BC74            BEQ    BKPERR

01010                   * ENTRY FROM CRTS - PR REGS, RTN TO MAIN
01011A BC6B 8D C7 BC34 ENDCAL BSR  RBRK       REMOVE BRKPNT FROM CODE
01012A BC6D 9C E9    A            CPX    TEMPA      BRKPNT SET?
01013A BC6F 26 03 BC74            BNE    BKPERR
01014                   * REG A=0 IF BRKTAB FINE BRKPNT
01015A BC71 4C                    INCA
01016A BC72 20 04 BC78            BRA    SWI3
01017A BC74 4F             BKPERR CLRA
01018A BC75 5F                    CLRB
01019A BC76 DD FA    A            STD    NTRACE     RESET NUM INSTR TO TRACE
01020A BC78 97 FC    A  SWI3      STAA   EXONE      CLR XQT 1 INSTR
01021A BC7A BD BB17  A            JSR    PREGS1
01022A BC7D 7E B8EA  A            JMP    MAIN       GO TO MAIN LOOP

01024                   ********** DISPLAY **********
01025                   * D    OR D <ADR>   OR D <ADR> <ADR>
01026                   * DISPLAY MEMORY - BLK OF MEMORY AROUND LAST
01027                   *   REFERENCED BYTE FROM MEM/EX
01028                   * DISPLAY 16 BYTES AROUND <ADR> SPECIFIED
01029                   * OR DISPLAY FROM <ADR> TO <ADR> MOD 16
01030                   * ASCII CHAR WILL BE PRINTED ON THE RIGHT
01031                   * MEM/EX PNTR WILL PNT TO LAST ADR REFERENCED
01032                   * AT END OF DISPLAY COMMAND
01033                   *
01034A BC80 DE E7    A  DISPLY LDX PNTR       SAVE MEMORY/EX PNTR
01035A BC82 3C                    PSHX
01036A BC83 81 0D    A            CMPA   #$D        CR?
01037A BC85 27 0A BC91            BEQ    SHOW35     NO ARG
01038A BC87 8D 7C BD05            BSR    PVALIN
01039A BC89 23 16 BCA1            BLS    SHERR2     ERR IF NOT HEX, OR ABORT
01040A BC8B DF E7    A            STX    PNTR
01041A BC8D 81 0D    A            CMPA   #$D        CR?
01042A BC8F 26 15 BCA6            BNE    SHOW4
01043A BC91 DC E7    A  SHOW35 LDD PNTR       DEFINE BLK TO DMP
01044A BC93 C4 F0    A            ANDB   #$F0       MASK OUT LOW DIGIT
01045A BC95 83 0010  A            SUBD   #$10
01046A BC98 DD E7    A            STD    PNTR
01047A BC9A C3 0020  A            ADDD   #$20
01048A BC9D DD E9    A            STD    TEMPA      TO ADR
01049A BC9F 20 19 BCBA            BRA    SHOW8
01050A BCA1 38             SHERR2 PULX            RESET MEM/EX PNTR
01051A BCA2 DF E7    A            STX    PNTR
01052A BCA4 0D             SHERR  SEC             ERROR RETURN
01053A BCA5 39                    RTS
01054A BCA6 8D 5D BD05 SHOW4  BSR  PVALIN     READ HEX #
01055A BCA8 23 F7 BCA1            BLS    SHERR2     JMP IF ERR
01056A BCAA DC E7    A            LDD    PNTR       FROM ADR < TO ADR?
01057A BCAC C4 F0    A            ANDB   #$F0       MASK OUT LOW ORDER DIGIT
01058A BCAE D7 E8    A            STAB   PNTR+1
01059A BCB0 93 E9    A            SUBD   TEMPA
01060A BCB2 22 ED BCA1            BHI    SHERR2
01061A BCB4 96 EA    A            LDAA   TEMPA+1    MASK TO FULL LINE
01062A BCB6 84 F0    A            ANDA   #$F0
01063A BCB8 97 EA    A            STAA   TEMPA+1    CHANGES LAST REF ADR
01064          BCBA  A  SHOW8 EQU   *
01065                   * ADR ARE DIVISIBLE BY 16
01066                   * ADR OF BLOCK WAS IN REG X
01067                   * X SAVED ON STK BY IO
01068A BCBA BD BAA3  A  SHOW9  JSR  PCRLF      LINE FEED
01069                   * CHECK IF USER WANT TO TERMINT DISPLAY CMD
01070A BCBD 8D 49 BD08 SHOW10 BSR  CHKABT
01071A BCBF 26 05 BCC6            BNE    SHOW11     RETURN IF CONTROL X
01072A BCC1 38             SHOW19 PULX            RETRIEVE MEM/EX PNTR
01073A BCC2 DF E7    A            STX    PNTR
01074A BCC4 4F                    CLRA            CLEAR C FOR RETURN
01075A BCC5 39                    RTS
01076A BCC6 BD BAA3  A  SHOW11 JSR  PCRLF
01077A BCC9 CE 00E7  A            LDX    #PNTR      GET ADR OF LINE
01078A BCCC BD BA69  A            JSR    OUT4HS     PRINT ADR
01079A BCCF DE E7    A            LDX    PNTR       GET CONTENTS OF MEMORY
01080A BCD1 C6 10    A            LDAB   #16        CNTR FOR LINE
01081A BCD3 BD BA6C  A  SHOW12 JSR  OUT2HS     PR DATA
01082A BCD6 08                    INX             INCR ADR PNTR
01083A BCD7 5A                    DECB
```

```
01084A BCD8 26 F9 BCD3           BNE     SHOW12     LOOP
01085A BCDA BD BA6E  A           JSR     SPACE      PRINT ASCII DUMP
01086A BCDD C6 10    A           LDAB    #16        NUM CHAR/LINE
01087A BCDF DE E7    A           LDX     PNTR
01088A BCE1 A6 00    A  SHOW14   LDAA    0,X
01089A BCE3 84 7F    A           ANDA    #$7F       CHK PRINTABLE
01090A BCE5 81 20    A           CMPA    #$20
01091A BCE7 2D 04 BCED           BLT     SHOW16     NON-CHAR
01092A BCE9 81 61    A           CMPA    #$61
01093A BCEB 2D 02 BCEF           BLT     SHOW18
01094A BCED 86 2E    A  SHOW16   LDAA    #'.        PR . FOR NON-CHAR
01095A BCEF BD B87F  A  SHOW18   JSR     OUTCH
01096A BCF2 08                   INX
01097A BCF3 5A                   DECB
01098A BCF4 26 EB BCE1           BNE     SHOW14     LOOP
01099A BCF6 DC E9    A           LDD     TEMPA
01100A BCF8 93 E7    A           SUBD    PNTR
01101A BCFA 27 C5 BCC1           BEQ     SHOW19     RETURN
01102A BCFC DF E7    A           STX     PNTR       SAVE FROM ADR
01103A BCFE 7D 00E8  A           TST     PNTR+1
01104A BD01 26 BA BCBD           BNE     SHOW10     END OF LINE
01105A BD03 20 B5 BCBA           BRA     SHOW9      END OF BLOCK

01107A BD05 7E B98A  A  PVALIN   JMP     VALINP     SAVE BYTES

01109                            ************* CHKABT **************
01110                            * READ WITH NO WAIT
01111                            * CHCK FOR CONTROL X - ESCAPE FROM PRINT
01112                            * CHCK FOR CONTROL W - WAIT DURING T OR D PRINT
01113                            *     ANY CHAR CONTINUES PRINT
01114A BD08 36                   CHKABT  PSHA
01115A BD09 BD B868  A           JSR     CIDTA      READ A CHAR
01116A BD0C 84 7F    A           ANDA    #$7F       CLEAR PARITY
01117A BD0E 81 17    A           CMPA    #CNTLW     CONTROL W?
01118A BD10 26 07 BD19           BNE     CHK2       IF SO WAIT FOR INPUT
01119A BD12 BD B868  A  CHK1     JSR     CIDTA      TO CONTINUE PRINT
01120A BD15 24 FB BD12           BCC     CHK1       LOOP IF NO INPUT
01121A BD17 84 7F    A           ANDA    #$7F       REMOVE PARITY
01122A BD19 81 18    A  CHK2     CMPA    #CNTLX     CONTROL X?
01123                            * RETURN WITH CC SET
01124A BD1B 32                   PULA
01125A BD1C 39                   RTS

01127                            ************* RD2ADR **************
01128                            * READ <DELIM> <ADR1> <ADR2>
01129A BD1D 81 0D    A  RD2ADR   CMPA    #$0D       CR?
01130A BD1F 27 12 BD33           BEQ     PNCHER
01131A BD21 8D E2 BD05           BSR     PVALIN     CALL INPUT ROUTINE
01132A BD23 23 0E BD33           BLS     PNCHER     CHK IF NUMBER
01133A BD25 DF E7    A           STX     BBLK+1     SAVE 1ST ADR (PNTR)
01134                            * INPUT CHECKS FOR DELIMITER
01135A BD27 81 0D    A           CMPA    #$D        CR?
01136A BD29 27 08 BD33           BEQ     PNCHER     DO NOT ALLOW CR
01137A BD2B 8D D8 BD05  PNCH3    BSR     PVALIN     READ NEXT ADR
01138A BD2D 23 04 BD33           BLS     PNCHER     VALID ADR?
01139A BD2F 81 0D    A           CMPA    #$D        REQUIRE CR AFTER ADR
01140A BD31 27 01 BD34           BEQ     PNCRTN
01141A BD33 0D                   PNCHER  SEC                   ERR RETURN
01142A BD34 39                   PNCRTN  RTS

01144                            ************* PUNCH **************
01145                            * P <ADR1> <ADR2>
01146                            * PUNCH FROM <ADR1> TO <ADR2>
01147                            * ERROR IF <ADR2> LT <ADR1>
01148                            * SET UP TRANSFER PACKET
01149                            * 1ST WRD - FCN FOR PUNCH = 0
01150                            * 2ND, 3RD WRDS = <ADR1>
01151                            * 4TH, 5TH WRDS = <ADR2>
01152                            * LDX W/ ADR OF TRANSFER PACKET
01153                            * JMP THRU IO VECTOR TO BSDTA
01154A BD35 7F 00E6  A  PUNCH    CLR     BBLK       SET BULK STR FCN
01155A BD38 8D E3 BD1D           BSR     RD2ADR     READ 2 ADDRESSES
01156A BD3A 25 F8 BD34           BCS     PNCRTN     ERR CHECK
01157                            * HEX STILL IN TEMPA (BBLK+3) - END ADR
01158A BD3C BD BAA3  A  PNCH4    JSR     PCRLF
01159                            * SET NO ECHO FLAG/ TAPE FLAG
01160A BD3F 86 10    A           LDAA    #$10       * NULLS W/TAPE CR
01161A BD41 97 FE    A           STAA    OUTSW
```

```
01162                    * TURN PUNCH ON FOR READ/WRITE
01163                    * BBLK MUST BE SET - BBLK = 0 WRITE
01164                    *                     BBLK # 0 READ
01165A BD43 4C                   INCA         SET REG A = $11
01166A BD44 D6 E6    A           LDAB  BBLK
01167A BD46 26 01 BD49           BNE   BSON2  JUMP IF VERF/LOAD

01168A BD48 4C                   INCA         ADJUST FOR WRITE
01169A BD49 BD B87F  A   BSON2   JSR   OUTCH
01170A BD4C BD BD78  A           JSR   BSDTA
01171A BD4F 46                   RORA         SAVE CARRY BIT
01172A BD50 36                   PSHA         SAVE FOR RETURN C
01173                    * TURN PUNCH OFF
01174A BD51 CE BFA5  A           LDX   #PUNOFF
01175A BD54 BD B8A3  A           JSR   COON2  OUTPUT STRG & DELAY
01176A BD57 BD BD08  A           JSR   CHKABT CLEAR IO BUF
01177A BD5A BD BD08  A           JSR   CHKABT DOUBLE BUF
01178A BD5D 7F 00FE  A           CLR   OUTSW  TURN PR ON
01179A BD60 32                   PULA
01180A BD61 49                   ROLA         RESET C BIT-ERR INDICATOR
01181A BD62 39                   RTS

01183                    ************ LOAD ***************
01184                    * L   LOAD A TAPE FILE
01185                    * L <OFFSET>  LOAD WITH AN OFFSET
01186                    * SET FUNCTION IN BULK STORE PACKET
01187                    * IF OFFSET - 3RD, 4TH WRDS OF PACKET = OFFSET
01188                    * LDX W/ ADR OF TRANSFER PACKET
01189                    * JMP THRU IO VECTOR TO BSDTA
01190A BD63 C6 01    A   LOAD    LDAB  #1     SET LOAD FCN = 1
01191A BD65 D7 E6    A   LOAD2   STAB  BBLK
01192A BD67 CE 0000  A           LDX   #0     INIT OFFSET=0
01193A BD6A DF E9    A           STX   BBLK+3
01194A BD6C 81 0D    A           CMPA  #$D    CR?
01195A BD6E 27 CC BD3C           BEQ   PNCH4  YES
01196A BD70 8D B9 BD2B           BSR   PNCH3
01197A BD72 20 C8 BD3C           BRA   PNCH4

01199                    ************ VERIFY *************
01200                    * V   VERIFY THAT TAPE LOADED CORRECTLY
01201                    * V <OFFSET> CHECK PROG LOADED WITH OFFSET CORRECTLY
01202                    * SET FCN IN BULK STORE PACKET
01203                    * IF OFFSET - 3RD, 4TH WRDS = OFFSET
01204                    * LDX W/ ADR OF PACKET
01205                    * JMP THRU IO VECTOR TO BSDTA
01206A BD74 C6 FF    A   VERF    LDAB  #$FF
01207A BD76 20 ED BD65           BRA   LOAD2

01209                    ********** BSDTA ***********
01210A BD78 5D           BSDTA   TSTB         BBLK IS IN REG B
01211A BD79 27 58 BDD3           BEQ   BSPUN  JUMP TO PUNCH, FCN=0
01212                    * FALL THRU TO VERF-BBLK=-1, LOAD-BBLK=1

01214                    * VERIFY, LOAD
01215                    * GET OFFSET FROM IO PACKET
01216                    * FIND S1 REC - DATA
01217                    * READ BYTE CNT (TEMP)
01218                    * READ ADDRESS - SET REG X
01219                    * READ & STORE DATA, COMPUTE CHK SUM
01220                    * COMPARE TAPE TO COMPUTED CKSUM
01221A BD7B DC E9    A           LDD   TEMPA  GET OFFSET
01222A BD7D DD E7    A           STD   PNTR   SAVE OFFSET PARAMETER
01223A BD7F BD B853  A   LOAD3   JSR   INCHNP READ
01224A BD82 81 53    A   LOAD4   CMPA  #'S    GET 1ST GOOD REC
01225A BD84 26 F9 BD7F           BNE   LOAD3
01226A BD86 BD B853  A           JSR   INCHNP
01227A BD89 81 39    A           CMPA  #'9
01228A BD8B 27 31 BDBE           BEQ   LOAD20 FINI AFTER S9
01229A BD8D 81 31    A           CMPA  #'1    DATA REC
01230A BD8F 26 F1 BD82           BNE   LOAD4  NO
01231A BD91 7F 00E0  A           CLR   CKSUM  INIT CHECK SUM
01232A BD94 8D 29 BDBF           BSR   BYTE   GET BYTE CNT
01233A BD96 C0 02    A           SUBB  #2     DECR BYTE CNT FROM IT
01234A BD98 D7 EB    A           STAB  TEMP   STORAGE FOR BYTE CNT
01235                    * READ 4 HEX DIGITS FROM INPUT
01236                    * FORM ADDRESS AND STORE IN REG X
01237A BD9A 8D 23 BDBF           BSR   BYTE   1 BYTE
01238A BD9C 37                   PSHB         SAVE 1ST BYTE
```

```
01239A BD9D 8D 20 BDBF         BSR     BYTE    2ND BYTE
01240A BD9F 32                 PULA            GET 1ST BYTE
01241A BDA0 D3 E7     A        ADDD    PNTR    ADD OFFSET
01242A BDA2 37                 PSHB            MOVE A:B TO X
01243A BDA3 36                 PSHA
01244A BDA4 38                 PULX            SET REG X = ADR
01245                    * STORE DATA
01246A BDA5 8D 18 BDBF LOAD11  BSR     BYTE    GET BYTE IN REG B
01247A BDA7 7A 00EB   A        DEC     TEMP    DEC BYTE CNT
01248A BDAA 27 0E BDBA         BEQ     LOAD15  END REC?
01249A BDAC 7D 00E6   A        TST     BBLK    SKIP STORE IF VERF
01250A BDAF 2B 02 BDB3         BMI     LOAD12  JUST COMPARE
01251A BDB1 E7 00     A        STAB    0,X
01252A BDB3 E1 00     A LOAD12 CMPB    0,X
01253A BDB5 26 06 BDBD         BNE     LOAD19  ERROR
01254A BDB7 08                 INX
01255A BDB8 20 EB BDA5         BRA     LOAD11
01256                    * CHECKSUMS GOOD?
01257                    * CKSUM IS ONE'S COMPLE
01258A BDBA 4C         LOAD15  INCA            CHKSUM ADDED INTO B
01259A BDBB 27 C2 BD7F         BEQ     LOAD3   GET NEXT REC
01260                    * CHECKSUM ERROR, VERF FAILURE, LOAD FAIL ERR
01261A BDBD 0D         LOAD19  SEC             SET ERR RETURN
01262A BDBE 39         LOAD20  RTS

01264                    ************ BYTE **************
01265                    * FORM A HEX BYTE FROM 2 DISPLAY BYTES
01266                    * CALL INHEX TO READ 1 HEX DIGIT FROM INPUT
01267A BDBF 5F         BYTE    CLRB            READ A-F AS HEX
01268A BDC0 BD B9CF   A        JSR     INHEX
01269A BDC3 C6 10     A        LDAB    #16
01270A BDC5 3D                 MUL             LSB IN REG B
01271A BDC6 37                 PSHB            SAVE
01272A BDC7 5F                 CLRB            FLAG FOR INHEX
01273A BDC8 BD B9CF   A        JSR     INHEX
01274A BDCB 33                 PULB
01275A BDCC 1B                 ABA             GET 1 BYTE
01276A BDCD 16                 TAB             SAVE IN B
01277A BDCE 9B E0     A        ADDA    CKSUM
01278A BDD0 97 E0     A        STAA    CKSUM
01279A BDD2 39                 RTS

01281                    ********** BSDTA - PUNCH **********
01282                    * PNTR - FROM ADR   TEMPA - TO ADR
01283                    * BBLK - REUSED FOR FRAME CNT
01284                    * TEMP - REUSED FOR BYTE CNT
01285                    * PUNCH NULLS AS LEADER ON TAPE
01286                    * PUNCH CR/LF, NULL, S1(RECORD TYPE),
01287                    *       FRAME COUNT, ADDRESS, DATA, CHECKSUM
01288                    * EOF RECORD - S9030000FC
01289            BDD3  A BSPUN  EQU     *
01290                    * PUNCH LEADER
01291A BDD3 C6 19     A        LDAB    #25
01292A BDD5 4F         PNULL   CLRA            OUTPUT NULL CHAR
01293A BDD6 BD B87F   A        JSR     OUTCH
01294A BDD9 5A                 DECB
01295A BDDA 26 F9 BDD5         BNE     PNULL   LOOP IF NOT FINI
01296A BDDC DC E9     A PUN11  LDD     TEMPA
01297A BDDE D0 E8     A        SUBB    PNTR+1
01298A BDE0 92 E7     A        SBCA    PNTR    FROM ADR < TO ADR?
01299A BDE2 26 04 BDE8         BNE     PUN22
01300A BDE4 C1 18     A        CMPB    #24
01301A BDE6 25 02 BDEA         BCS     PUN23
01302A BDE8 C6 17     A PUN22  LDAB    #23     SET FRAME CNT
01303A BDEA CB 04     A PUN23  ADDB    #4
01304A BDEC D7 E6     A        STAB    BBLK
01305A BDEE C0 03     A        SUBB    #3
01306A BDF0 D7 EB     A        STAB    TEMP    BYTE CNT THIS REC
01307                    * PUNCH CR/LF, NULLS,S,1
01308A BDF2 CE BFBC   A        LDX     #MTAPE
01309A BDF5 BD BA9F   A        JSR     PDATA
01310A BDF8 5F                 CLRB            ZERO CHKSUM
01311                    * PUNCH FRAME CNT
01312A BDF9 CE 00E6   A        LDX     #BBLK
01313A BDFC 8D 29 BE27         BSR     PUNT2   PUNCH 2 HEX CHAR
```

```
01314                        * PUNCH ADDRESS
01315A BDFE CE 00E7  A         LDX   #PNTR
01316A BE01 8D 24 BE27         BSR   PUNT2
01317A BE03 08                 INX
01318A BE04 8D 21 BE27         BSR   PUNT2
01319                        * PUNCH DATA
01320A BE06 DE E7    A         LDX   PNTR
01321A BE08 8D 1D BE27 PUN32   BSR   PUNT2    PUNCH 1BYTE (2 FRAMES)
01322A BE0A 08                 INX            INCR X PNTR
01323A BE0B 7A 00EB  A         DEC   TEMP     DECR BYTE CNT
01324A BE0E 26 F8 BE08         BNE   PUN32
01325A BE10 DF E7    A         STX   PNTR
01326A BE12 53                 COMB
01327A BE13 37                 PSHB
01328A BE14 30                 TSX
01329A BE15 8D 10 BE27         BSR   PUNT2    PUNCH CHKSUM
01330A BE17 33                 PULB           RESTORE
01331A BE18 DE E7    A         LDX   PNTR
01332A BE1A 09                 DEX
01333A BE1B 9C E9    A         CPX   TEMPA
01334A BE1D 26 BD BDDC         BNE   PUN11
01335A BE1F CE BFBF  A         LDX   #MEOF    PUNCH EOF
01336A BE22 BD BA9F  A         JSR   PDATA
01337A BE25 4F                 CLRA           CLEAR C FOR RETURN
01338                        * CLRA ALSO CLEARS C BIT-GOOD RETURN
01339A BE26 39                 RTS
01340                        * PUNCH 2 HEX CHAR, UPDATE CHKSUM
01341A BE27 EB 00    A PUNT2   ADDB  0,X
01342A BE29 7E 3A72  A         JMP   OUT2H    OUTPUT 2 HEX & RTN

01344                        *************************************************
01345                        * CHECK FOR ALL 0'S (ERASED STATE)
01346                        * COMMAND IS IN THE FORM:
01347                        * CHCK [AAAA] [BBBB]
01348                        *************************************************
01349A BE2C 81 0D    A CHCK    CMPA  #$0D     DON'T ALLOW CR
01350A BE2E 27 73 BEA3         BEQ   PERRTN
01351A BE30 BD BD1D  A         JSR   RD2ADR   INPUT ADDRESS AAAA & BBBB
01352A BE33 9C E7    A         CPX   PNTR     IS AAAA<=BBBB?
01353A BE35 25 6C BEA3         BLO   PERRTN   ERROR
01354                        *************************************************
01355                        * ENTRY POINT FOR ALL 0 CHECK FROM PROGRAM COMMAND
01356                        * FROM ADDRESS IS IN PNTR
01357                        * TO ADDRESS IS IN TEMPA
01358A BE37 CC FF86  A CHCKIT  LDD   #$FF86   INIT FOR READ
01359A BE3A 97 14    A         STAA  ECONR    SET PGE, CS = 1
01360A BE3C D7 EB    A         STAB  TEMP     STORE FLAG
01361A BE3E DE E7    A         LDX   PNTR     INITIALIZE POINTER
01362A BE40 09                 DEX            ADJUST FOR LOOP
01363A BE41 08        CHCK4A   INX            NEXT MEMORY LOC
01364A BE42 E6 00    A         LDAB  0,X      GET A BYTE
01365A BE44 27 05 BE4B         BEQ   CHCK8    =0(ERASED)?
01366A BE46 4F                 CLRA           SET FOR PRT ERR MSG
01367A BE47 8D 0F BE58         BSR   ERPRT    ERROR PRINT
01368A BE49 27 08 BE53         BEQ   CHCK11
01369A BE4B 9C E9    A CHCK8   CPX   TEMPA    ARE WE THROUGH?
01370A BE4D 26 F2 BE41         BNE   CHCK4A
01371A BE4F 7F 00FD  A CHCK9   CLR   VFLAG    CLR VERIFY FLAG
01372A BE52 39                 RTS
01373A BE53 7F 00FD  A CHCK11  CLR   VFLAG    ERROR RETURN
01374A BE56 0D                 SEC
01375A BE57 39                 RTS

01377                        *************************************************
01378                        * ERROR PRINT ROUTINE
01379                        * CALLED BY CHCKIT AND VERIFY AFTER ERROR FOUND
01380                        * REG B IS ERROR FLAG, HI BIT INDICATE TITLE PRINTED
01381                        *   LOW 4 BITS CNT DOWN # BYTES PER LINE
01382                        * INITIALIZE REG B = $86
01383A BE58 36        ERPRT    PSHA           SAVE GOOD VALUE
01384A BE59 37                 PSHB           SAVE EPROM VALUE
01385A BE5A 3C                 PSHX           SAVE EPROM ADR
01386A BE5B D6 EB    A         LDAB  TEMP     HEADER PRINTED?
01387A BE5D 2A 08 BE67         BPL   ERPRT2   YES
01388A BE5F CE BFE6  A         LDX   #ADED    OUTPUT HEADER
```

```
01389A BE62 BD BA9F  A           JSR    PDATA
01390A BE65 C4 0F    A           ANDB   #$F       CLR UPPER BIT FLAG
01391A BE67 26 05 BE6E ERPRT2    BNE    ERPRT4    BYTE CNT CHECK
01392A BE69 C6 06    A           LDAB   #$6       RESET BYTE CNT
01393A BE6B BD BAA3  A           JSR    PCRLF     OUTPUT CR,LF
01394A BE6E 30           ERPRT4  TSX              POINT TO X
01395A BE6F BD BA69  A           JSR    OUT4HS    OUTPUT ADR X
01396A BE72 08                   INX              PNT TO EPROM VALUE
01397A BE73 BD BA6C  A           JSR    OUT2HS    OUTPUT BAD BYTE
01398A BE76 86 2F    A           LDAA   #'/       PRINT '/'
01399A BE78 BD B87F  A           JSR    OUTCH

01400A BE7B 08                   INX              SKIP OVER B REG ON STK
01401A BE7C BD BA6C  A           JSR    OUT2HS    PRT VALUE
01402A BE7F BD BA6E  A           JSR    SPACE
01403A BE82 5A                   DECB             ADJUST ERROR CNT
01404A BE83 38                   PULX             RESET EPROM ADR
01405A BE84 D7 EB    A           STAB   TEMP      RESET FLAG
01406A BE86 33                   PULB
01407A BE87 32                   PULA             REMOVE VALUE
01408A BE88 BD BD08  A           JSR    CHKABT    ALLOW CNTRL X
01409A BE8B 39                   RTS

01411A BE8C CE BFE1  A OUTPWR    LDX    #PWR
01412A BE8F 3C         OUTMSG    PSHX             SAVE BEG MSG
01413A BE90 BD BA9F  A           JSR    PDATA     PRINT MSG
01414A BE93 BD B653  A           JSR    INCHNP    WAIT FOR RESPONSE
01415A BE96 38                   PULX             RESET BEG MSG
01416A BE97 81 59    A           CMPA   #'Y       Y IS CORRECT RESPONSE
01417A BE99 39                   RTS

01419                            ************************************************
01420                            * PROGRAM COMMAND
01421                            * COMMAND IS IN THE FORM:
01422                            *  PROG [XXXX] [YYYY] [AAAA]
01423                            * CHECKS FOR ERASED STATE,PROGRAMS,VERIFIES
01424                            ************************************************
01425A BE9A 81 0D    A PGM       CMPA   #$0D      DON'T ALLOW CR
01426A BE9C 27 05 BEA3           BEQ    PERRTN
01427A BE9E BD BF11  A           JSR    GETAD     GET ADDRESSES & CHECK
01428A BEA1 24 02 BEA5           BCC    PGM3      ANY RANGE,INPUT ERRORS?
01429A BEA3 0D         PERRTN    SEC              ERROR RETURN
01430A BEA4 39                   RTS
01431A BEA5 BD BE37  A PGM3      JSR    CHCKIT    CHECK FOR ALL ERASED
01432A BEA8 24 07 BEB1           BCC    PGM4
01433A BEAA CE BFDB  A           LDX    #CMSG     CHG MESSAGE
01434A BEAD 8D E0 BE8F           BSR    OUTMSG
01435A BEAF 26 F2 BEA3           BNE    PERRTN    ERROR IF NOT GET 'Y'
01436A BEB1 8D D9 BE8C PGM4      BSR    OUTPWR    PRT MSG & WAIT
01437A BEB3 26 EE BEA3           BNE    PERRTN    ERR IF NOT GET 'Y'
01438A BEB5 86 FE    A           LDAA   #$FE      SET PGE=1,PLE=0
01439A BEB7 97 14    A           STAA   ECONR
01440A BEB9 DE E7    A           LDX    PNTR      SAVE BEG EPROM ADR
01441A BEBB 3C                   PSHX
01442A BEBC DE DC    A PGM55     LDX    IMBEG     UPDATE TEMP STORAGE
01443A BEBE 09                   DEX              ADJUST FOR LOOP
01444A BEBF 3C                   PSHX             SAVE ADR
01445A BEC0 38         PGM6      PULX             START PROG LOOP
01446A BEC1 9C DE    A           CPX    IMEND     OVER END?
01447A BEC3 26 13 BED8           BNE    PGM65     NOT END YET
01448A BEC5 7D 00FD  A PGM63     TST    VFLAG     VERIFYING
01449A BEC8 2B 85 BE4F           BMI    CHCK9     YES - QUIT
01450A BECA 38                   PULX             RESET EPROM BEG ADR
01451A BECB DF E7    A           STX    PNTR
01452A BECD 8D BD BE8C PGM62     BSR    OUTPWR
01453A BECF 27 FC BECD           BEQ    PGM62     RESPONSE = 'Y'?
01454A BED1 81 4E    A           CMPA   #'N       CORRECT RESPONSE?
01455A BED3 26 F8 BECD           BNE    PGM62
01456A BED5 7E BF4C  A           JMP    VFY2      GO SET FOR VERIFY
01457A BED8 08         PGM65     INX              BUMP MEM PTR

01458A BED9 A6 00    A           LDAA   0,X       GET MEMORY DATA
01459A BEDB 3C                   PSHX             SAVE IMAGE PNTR
01460A BEDC DE E7    A           LDX    PNTR      GET EPROM PTR
01461A BEDE 7D 00FD  A           TST    VFLAG     VERIFY?
01462A BEE1 2B 1C BEFF           BMI    PGM75     YES
01463A BEE3 A7 00    A           STAA   0,X       STORE THE DATA
01464A BEE5 36                   PSHA             SAVE DATA
01465A BEE6 86 FC    A           LDAA   #$FC      SET PGE,PLE=0
```

```
01466A BEE8 97 14     A            STAA    ECONR
01467A BEEA 96 08     A            LDAA    TCSR         DUMMY READ
01468A BEEC DC DA     A            LDD     WAITT        GET WAIT TIME
01469A BEEE D3 09     A            ADDD    CLOCK        ADD TO CURRENT TIME
01470A BEF0 DD 0B     A            STD     OCREG        PUT IN COMPARE REG
01471A BEF2 96 08     A    PGM7    LDAA    TCSR         WAIT LOOP FOR COMPARE
01472A BEF4 84 40     A            ANDA    #$40
01473A BEF6 27 FA BEF2             BEQ     PGM7
01474A BEF8 86 FE     A            LDAA    #$FE         . SET PLE=0,PGE=1
01475A BEFA 97 14     A            STAA    ECONR
01476A BEFC 32                     PULA                 GET DATA WORD
01477A BEFD 20 0D BF0C             BRA     PGM77        SKIP VERIFY PART
01478                      * VERIFY
01479A BEFF E6 00     A    PGM75   LDAB    0,X          COMPARE TO EPROM
01480A BF01 11                     CBA
01481A BF02 27 08 BF0C             BEQ     PGM77        OK
01482A BF04 BD BE58   A            JSR     ERPRT        PRINT ERROR ADR
01483A BF07 26 03 BF0C             BNE     PGM77        ABORT?
01484A BF09 38                     PULX                 YES
01485A BF0A 20 B9 BEC5             BRA     PGM63        RETURN
01486A BF0C 08             PGM77   INX                  BUMP EPROM PNTR
01487A BF0D DF E7     A            STX     PNTR
01488A BF0F 20 AF BEC0             BRA     PGM6
01489                      ************************************************
01490                      * GET ADDRESSES FOR PROGRAM AND VERIFY
01491                      * INPUTS ADDRESSES XXXX,YYYY,AAAA
01492                      ************************************************
01493A BF11 BD B98A   A    GETAD   JSR     VALINP       GO GET ADDRESS XXXX
01494A BF14 2F 8D BEA3             BLE     PERRTN
01495A BF16 DF DC     A            STX     IMBEG        SAVE
01496A BF18 81 0D     A            CMPA    #$0D         DON'T ALLOW CR
01497A BF1A 27 87 BEA3             BEQ     PERRTN       IF NOT, ERROR
01498A BF1C BD BD1D   A            JSR     RD2ADR       GO GET ADDRESS YYYY AND AAAA
01499A BF1F DC E7     A            LDD     PNTR         GET ADDRESS YYYY
01500A BF21 DD DE     A            STD     IMEND        SAVE IT
01501A BF23 81 F8     A            CMPA    #$F8         EPROM AT ADR $F800
01502A BF25 24 06 BF2D             BHS     GETADE
01503A BF27 DF E7     A            STX     PNTR         SAVE EPROM ADR
01504A BF29 93 DC     A            SUBD    IMBEG        YYYY-XXXX>=0?
01505A BF2B 24 03 BF30             BHS     GETAD5
01506A BF2D 7E BEA3   A    GETADE  JMP     PERRTN       OUTPUT ERROR MSG
01507A BF30 D3 E7     A    GETAD5  ADDD    .PNTR        (YYYY-XXXX)+AAAA>$FFFF?
01508A BF32 25 F9 BF2D             BCS     GETADE
01509A BF34 DD E9     A            STD     TEMPA        END EPROM
01510A BF36 DC DC     A            LDD     IMBEG
01511A BF38 81 F8     A            CMPA    #$F8
01512A BF3A 24 F1 BF2D             BHS     GETADE
01513A BF3C 96 E7     A            LDAA    PNTR         AAAA>=$F800?
01514A BF3E 81 F8     A            CMPA    #$F8
01515A BF40 25 EB BF2D             BLO     GETADE
01516A BF42 0C                     CLC                  GOOD RETURN
01517A BF43 39                     RTS
01518                      ************************************************
01519                      * VERIFY COMMAND
01520                      * COMMAND IS IN THE FORM:
01521                      * VERF [XXXX] [YYYY] [AAAA]
01522                      ************************************************
01523A BF44 81 0D     A    VFY     CMPA    #$0D         DON'T ALLOW CR
01524A BF46 27 52 BF9A             BEQ     OERRTN
01525A BF48 8D C7 BF11             BSR     GETAD        NO, GET ADDRESSES & CHECK
01526A BF4A 25 4E BF9A             BCS     OERRTN
01527                      * ENTRY POINT FOR VERIFY CHECK FROM PROGRAM
01528A BF4C CC FF86   A    VFY2    LDD     #$FF86       INIT FOR READ
01529A BF4F 97 14     A            STAA    ECONR        SET PGE, PLE = 1
01530A BF51 D7 EB     A            STAB    TEMP         SAVE FLAG
01531A BF53 D7 FD     A            STAB    VFLAG        SET VERIFY FLAG NEG
01532A BF55 7E BEBC   A            JMP     PGM55        MERGE INTO PGM CODE

01534A BF58    30     A    XMSG    FCC     /0) 2.45  1) 4.91/
01535A BF68    0D     A            FCB     $D,$A        CR/LF
01536A BF6A    58     A            FCC     /XTAL=/
01537A BF6F    04     A            FCB     4
01538                      ************************************************
01539                      * XTAL COMMAND
01540                      * COMMAND IS IN THE FORM:
```

```
01541                         * XTAL
01542                         * DISPLAYS CURRENT CRYSTAL FREQU PARAMETER
01543                         * AND SOLICITS NEW ONE
01544                         ************************************************
01545A BF70 CE BF58   A XTL    LDX    #XMSG
01546A BF73 BD BA9F   A        JSR    PDATA
01547A BF76 86 30     A        LDAA   #$30      OPTION 0?
01548A BF78 D6 DA     A        LDAB   WAITT
01549A BF7A C1 77     A        CMPB   #%2.45H   JUST CHK 1ST BYTE
01550A BF7C 27 01 BF7F         BEQ    XTL3
01551A BF7E 4C                 INCA             SHOULD BE OPTION 1
01552A BF7F BD B87F   A XTL3   JSR    OUTCH
01553A BF82 BD BA6E   A        JSR    SPACE
01554A BF85 BD B853   A        JSR    INCHNP    GET RESPONSE
01555A BF88 81 0D     A        CMPA   #$0D      REPONSE=CR?
01556A BF8A 27 12 BF9E         BEQ    XTL7
01557A BF8C CE 77EA   A        LDX    #%2.45    SET FOR OPT 0
01558A BF8F 80 30     A        SUBA   #$30      MAKE NUMERIC
01559A BF91 27 09 BF9C         BEQ    XTL5      XTAL=0
01560A BF93 CE EFEA   A        LDX    #%4.91    SET FOR OPT 1
01561A BF96 81 01     A        CMPA   #1        CHK IF 1
01562A BF98 27 02 BF9C         BEQ    XTL5      ERROR RETURN
01563A BF9A 0D                 OERRTN SEC
01564A BF9B 39                 RTS
01565A BF9C DF DA     A XTL5   STX    -WAITT
01566A BF9E 0C                 XTL7   CLC                 GOOD RETURN
01567A BF9F 39                 RTS
01568                          ********** ROM DATA **********
01569A BFA0    10     A PRTON  FCB    #10,$3A,#10,$39,4 TURN ON PRT
01570A BFA5    14     A PUNOFF FCB    #14,#13   TAPE CONTROL
01571A BFA7    04     A        FCB    4         EOF
01572A BFA8    3F     A QMARK  FCB    $3F,4     PR ?
01573A BFAA    50     A PRO    FCC    /PROBUG 1.0/
01574A BFB4    04     A        FCB    4
01575A BFB5    4E     A NOCHG  FCC    /NO CHG/
01576A BFBB    04     A        FCB    4         EOF
01577A BFBC    53     A MTAPE  FCB    'S,'1,4
01578A BFBF    53     A MEOF   FCC    /S9030000FC/
01579A BFC9    0D     A        FCB    #D,4
01580A BFCB    4F     A PRTOP  FCC    /OP-/
01581A BFCE    04     A        FCB    4
01582A BFCF    50     A ARRAY  FCB    'P,1      ARRAY OF REG AND WRD LEN
01583A BFD1    58     A        FCB    'X,1
01584A BFD3    41     A        FCB    'A,0
01585A BFD5    42     A        FCB    'B,0
01586A BFD7    43     A        FCB    'C,0
01587A BFD9    53     A        FCB    'S,1
01588A BFDB    43     A CMSG   FCC    /CHG? /
01589A BFE0    04     A        FCB    4
01590A BFE1    50     A PWR    FCC    /PWR?/
01591A BFE5    04     A        FCB    4
01592A BFE6    41     A ADED   FCC    #ADR ROM/VAL#
01593A BFF2    0D     A        FCB    #D,#A,4   CR/LF, EOF

01595A BFFA                    ORG    $BFFA
01596A BFFA BC5A      A        FDB    M.SWI     FOR BREAKPOINT
01597A BFFC BBBB      A        FDB    NMI       FOR XQT 1 INSTR (TRACE)
01598A BFFE B8BA      A        FDB    START     RESTART VECTOR
01599       B8BA      A        END    START
TOTAL ERRORS 00000
```

What is claimed is:

1. A single-chip microcomputer for use with:

off-chip program storage means for providing program information in response to the actuation thereof; and off-chip control means for providing, in response to the actuation thereof, control information defining a predetermined sequence for actuating said program storage means;

said microcomputer comprising:

input/output (I/O) means coupled to said program storage means and to said control means;

programmable read only memory (PROM) means for storing program information in response to the actuation thereof; and processor means coupled to the I/O means and to said PROM means, for actuating said control means via said I/O means to obtain said control information, actuating said program storage means via said I/O means in the predetermined sequence defined by said control information to obtain said program information, and actuating said PROM means to store the program information so obtained.

2. The microcomputer of claim 1 wherein the PROM means comprise an erasable programmable read only memory (EPROM).

3. The microcomputer of claim 1, wherein said PROM means also provide the program information store therein in response to the actuation thereof, and wherein the processor means actuates said PROM means to obtain the program information stored therein and compares the program information so obtained with the program information the PROM means were actuated to store.

4. The microcomputer of claim 1 or 3 wherein said control information comprises a computer program, and wherein said processor means operates in response to said computer program.

* * * * *